(12) United States Patent
Mizugaki

(10) Patent No.: US 6,538,948 B2
(45) Date of Patent: Mar. 25, 2003

(54) SEMICONDUCTOR DEVICE, REFRESHING METHOD THEREOF, MEMORY SYSTEM, AND ELECTRONIC INSTRUMENT

(75) Inventor: Koichi Mizugaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/972,053

(22) Filed: Oct. 9, 2001

(65) Prior Publication Data

US 2002/0048208 A1 Apr. 25, 2002

(30) Foreign Application Priority Data

Oct. 20, 2000 (JP) ........................................ 2000-320978

(51) Int. Cl.[7] .................................................. G11C 7/00
(52) U.S. Cl. .................... 365/222; 365/227; 365/233
(58) Field of Search ............................ 365/230.01, 222, 365/226, 227, 233

(56) References Cited

U.S. PATENT DOCUMENTS

| | | | | |
|---|---|---|---|---|
| 5,740,119 A | * | 4/1998 | Asakura et al | 365/222 |
| 5,822,257 A | * | 10/1998 | Ogawa | 365/200 |
| 5,867,439 A | * | 2/1999 | Asakura et al. | 365/222 |
| 5,970,507 A | * | 10/1999 | Kato et al. | 711/106 |
| 5,999,471 A | * | 12/1999 | Choi | 365/222 |
| 6,343,043 B2 | * | 1/2002 | Kai et al. | 365/222 |
| 2002/0049884 A1 | * | 4/2002 | Mizugaki et al. | 711/106 |

OTHER PUBLICATIONS

U.S. patent application (Atty. Docket #110808), Mizugaki, filed Oct. 9, 2001.

* cited by examiner

Primary Examiner—Viet Q. Nguyen
(74) Attorney, Agent, or Firm—Oliff & Berridge, PLC.

(57) ABSTRACT

A method of refreshing a semiconductor device such as a VSRAM. A memory cell array 20 of a semiconductor device 1 is divided into four blocks consisting of a block A, block B, block C, and block D. During a period in which data read or write operations is performed for one of the blocks, refreshing is performed for all the remaining blocks. A refresh cycle in a power saving state is caused to be longer than a refresh cycle in an operating state.

18 Claims, 15 Drawing Sheets

US 6,538,948 B2

SEMICONDUCTOR DEVICE, REFRESHING METHOD THEREOF, MEMORY SYSTEM, AND ELECTRONIC INSTRUMENT

Japanese Patent Application No. 2000-320978, filed Oct. 20, 2000 is hereby incorporated by reference in its entirety.

TECHNICAL FIELD

The present invention relates to a semiconductor device which retains data by refreshing, a method of refreshing the semiconductor device, a memory system, and an electronic instrument.

BACKGROUND

A virtually static RAM (VSRAM) is one type of semiconductor memory. Although memory cells of the VSRAM are the same as memory cells of a DRAM, the VSRAM does not need multiplexing of the column address and the row address. Moreover, the user can use the VSRAM without taking refreshing into consideration (transparency of refreshing).

A certain type of VSRAM is operated in two or more operating states such as a normal operating state and a power saving state. In such a VSRAM, sufficient consideration is not given to internal refreshing performed in each operating state. This problem is not limited to the VSRAM, but is common to dynamic type semiconductor memory devices equipped with a built-in refresh timer and refresh control sections.

SUMMARY

The present invention has been achieved to overcome the above conventional problem. An object of the present invention is to provide technology capable of performing refresh operations suitable for two or more operating states of a semiconductor memory device.

(1) A first aspect of the present invention provides a method of refreshing a semiconductor device including a memory cell array divided into a plurality of blocks, the method comprising:

a first step of making the semiconductor device externally accessible, a second step of refreshing a block other than a block to be externally accessed among the plurality of blocks of the memory cell array in a first refresh cycle when the semiconductor device is in an externally accessible state;

a third step of making the semiconductor device externally inaccessible; and a fourth step of refreshing each of the blocks in a second refresh cycle, which is longer than the first refresh cycle, when the semiconductor device is in an externally inaccessible state.

(2) A second aspect of the present invention provides a semiconductor device which holds data by refreshing, comprising:

a memory cell array divided into a plurality of blocks, and a refresh control circuit which refreshes a block other than a block to be externally accessed among the plurality of blocks of the memory cell array in a first refresh cycle when the semiconductor device is in an externally accessible state, and also refreshes each of the blocks in a second refresh cycle which is longer than the first refresh cycle when the semiconductor device is in an externally inaccessible state.

(3) A third aspect of the present invention provides a memory system comprising the semiconductor device as defined in the above (2).

(4) A fourth aspect of the present invention provides an electronic instrument comprising the semiconductor device as defined in the above (2).

Figure 1:
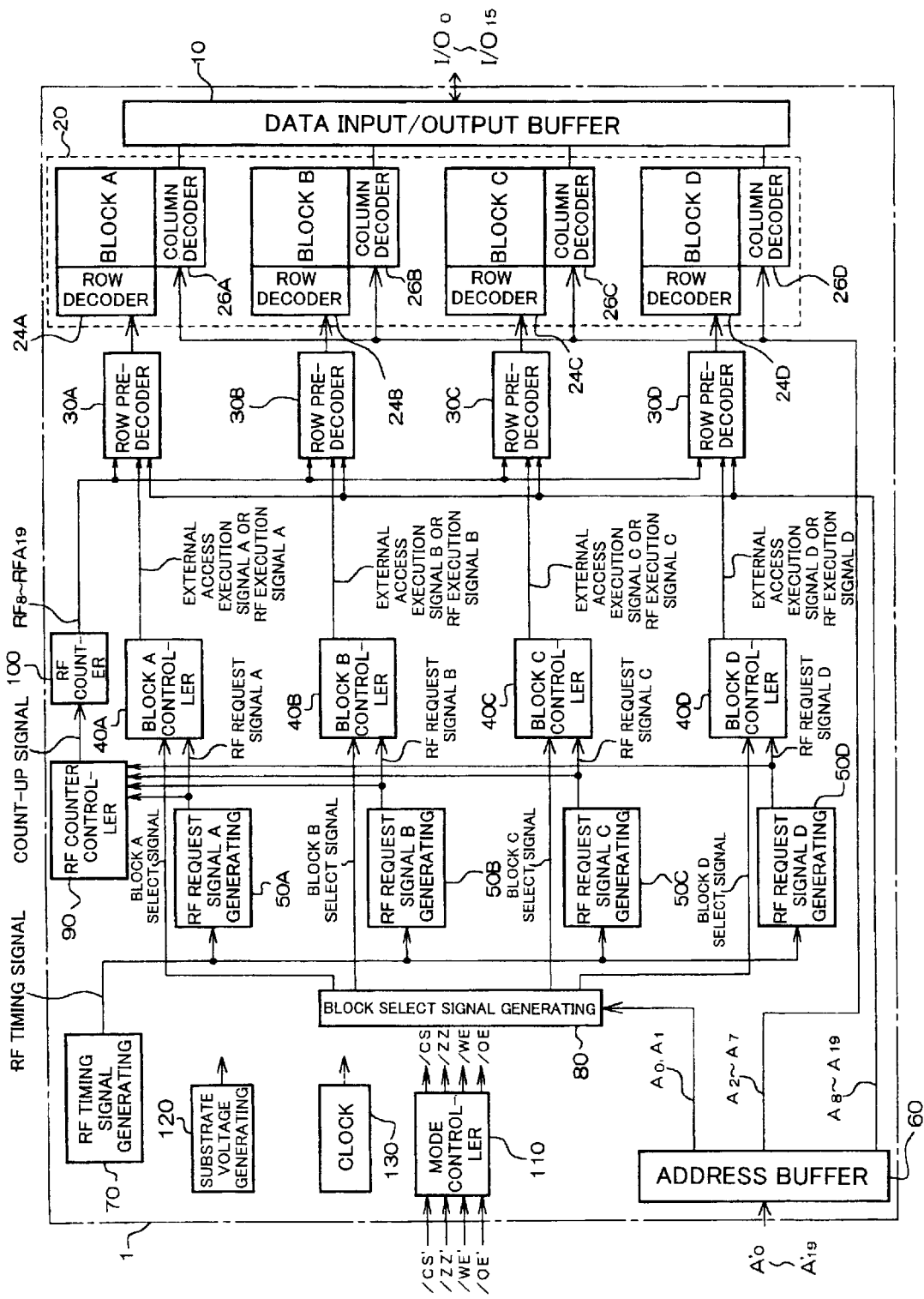
FIG. 1 is a circuit block diagram showing a semiconductor device according to an embodiment of the present invention.

DETAILED DESCRIPTION (1) According to one embodiment of the present invention, there is provided a method of refreshing a semiconductor device including a memory cell array divided into a plurality of blocks, the method comprising:

a first step of making the semiconductor device externally accessible, a second step of refreshing a block other than a block to be externally accessed among the plurality of blocks of the memory cell array in a first refresh cycle when the semiconductor device is in an externally accessible state;

a third step of making the semiconductor device externally inaccessible; and a fourth step of refreshing each of the blocks in a second refresh cycle, which is longer than the first refresh cycle, when the semiconductor device is in an externally inaccessible state.

According to this embodiment of the present invention, since the number of refreshing operations when the semiconductor device is in an externally inaccessible state (power saving state, for example) can be reduced, the power consumption can be reduced. The first refresh cycle and the second refresh cycle are determined taking the characteristics of the semiconductor device into consideration. For example, the second refresh cycle is two to ten times as long as the first refresh cycle. If the refresh cycles are determined by a divider (or a dividing controller), the second refresh cycle is two times, four times, or eight times as long as the first refresh cycle, for example.

According to this embodiment of the present invention, when the semiconductor device is in an externally accessible state, refreshing operation is performed for the block other than a block to be externally accessed while externally accessing the block to be externally accessed. Therefore, the semiconductor device can be operated efficiently.

The externally accessible state of the semiconductor device is an operating state, for example. The externally inaccessible state of the semiconductor device is a power saving state and/or a nonselected state, for example.

The number of blocks to be externally accessed may be one or more. The number of blocks to be externally accessed may depend on the design of the semiconductor device.

Refreshing of a block means refreshing of a memory cell in a specific row in the blocks, for example. The number of rows may be one or more. The number of rows may depend on the design of the semiconductor device.

External access means reading data from or writing data into the memory cell, for example.

(2) In this refreshing method, the second step may comprise a step of generating a first refresh timing signal having a first cycle which becomes a reference of the first refresh cycle, and the fourth step may comprise a step of generating a second refresh timing signal which becomes a reference of the second refresh cycle and has a second cycle which is longer than the first cycle.

The refresh cycles may be determined based on the cycles of the refresh timing signals. This enables the first refresh cycle to be determined by the refresh timing signal having the first cycle, and the second refresh cycle to be determined by the refresh timing signal having the second cycle. The refresh cycle is started at a timing at which the refresh timing signal becomes active, for example.

(3) According to another embodiment of the present invention, there is provided a semiconductor device which holds data by refreshing, comprising:

a memory cell array divided into a plurality of blocks, and a refresh control circuit which refreshes a block other than a block to be externally accessed among the plurality of blocks of the memory cell array in a first refresh cycle when the semiconductor device is in an externally accessible state, and also refreshes each of the blocks in a second refresh cycle which is longer than the first refresh cycle when the semiconductor device is in an externally inaccessible state.

According to this embodiment of the present invention, the refreshing method described in (1) can be carried out suitably.

(4) The semiconductor device according to this embodiment of the present invention may comprise:

a substrate voltage generating circuit which generates a substrate voltage to be applied to a semiconductor substrate on which the memory cell array is formed, wherein the substrate voltage generating circuit generates a voltage with the same value both in the externally accessible state and in the externally inaccessible state.

The substrate voltage is set to a value that the memory cells can hold data by the first refresh cycle when the semiconductor device is in an externally accessible state, and that the memory cells can hold data by the second refresh cycle when the semiconductor device is in an externally inaccessible state.

(5) In the semiconductor device according to this embodiment of the present invention, the refresh control circuit may comprise:

a refresh timing signal generating circuit which generates a refresh timing signal, a plurality of refresh request signal generating circuits each of which is provided for each of the blocks and generates a refresh request signal to each of the corresponding blocks based on the refresh timing signal; and a plurality of block controllers each of which is provided for each of the blocks and generates a refresh execution signal to a corresponding block based on the refresh request signal.

(6) In the semiconductor device according to this embodiment of the present invention, the refresh timing signal generating circuit may generate the refresh timing signal having a first cycle which becomes a reference of the first refresh cycle when the semiconductor device is in the externally accessible state, and the refresh timing signal generating circuit may generate the refresh timing signal having a second cycle which becomes a reference of the second refresh cycle when the semiconductor device is in the externally inaccessible state.

(7) In the semiconductor device according to this embodiment of the present invention, the refresh timing signal generating circuit may comprise:

an oscillation circuit which generates the refresh timing signal, and a voltage regulating circuit which regulates a voltage to be applied to the oscillation circuit in order to generate the refresh timing signal having either one of the first cycle and the second cycle.

(8) In the semiconductor device according to this embodiment of the present invention, the refresh timing signal generating circuit may comprise:
an oscillation circuit, and
a dividing controller which generates the refresh timing signal having either one of the first cycle and the second cycle, by dividing a signal from the oscillation circuit.

The refresh timing signals having the first cycle and the second cycle may be generated by the dividing controller. The signal from the oscillation circuit may be used as the refresh timing signal having the first cycle, and the refresh timing signal having the second cycle may be generated by the dividing controller.

(9) The semiconductor device according to this embodiment of the present invention may comprise a virtually static RAM (VSRAM).

(10) Still another embodiment of the present invention provides a memory system comprising the semiconductor device as defined in any one of the above (3) to (9).

(11) Yet another embodiment of the present invention provides an electronic instrument comprising the semiconductor device as defined in any one of the above (3) to (9).

A preferred embodiment of the present invention is described below in detail with reference to the drawings. The present embodiment illustrates an example in which the present invention is applied to a VSRAM.

1. Structure of Semiconductor Device

The structure of the present embodiment is described below. FIG. 1 is a circuit block diagram showing a semiconductor device 1 according to the present embodiment. Each block is described below.

(A) 16-bit data ($I/O_0$-$I/O_{15}$) is input to or output from a data input/output buffer 10.

(B) A memory cell array 20 includes a plurality of memory cells arranged in an array. Each memory cell includes an access transistor which is an n-type MOS transistor, and a capacitor for holding data. The memory cell array 20 is divided into four blocks consisting of a block A, a block B, a block C, and a block D. In the case where the memory cell array 20 has a capacity of 16 Mbits, each block has a capacity of 4 Mbits, for example. In the present invention, the memory cell array 20 is divided into at least two blocks. The number of blocks may be either odd or even.

Each block includes a plurality of word lines, a plurality of pairs of bit lines intersecting the word lines, and the memory cells provided corresponding to the intersection points between the word lines and the pairs of bit lines. The word lines correspond to the memory cells in each row of the blocks. Specifically, the memory cells in a row corresponding to a certain word line are selected by selecting the word line.

The blocks A to D includes row decoders 24A to 24D and column decoders 26A to 26D corresponding to each block. The word line is selected by the row decoder. The pair of bit lines is selected by the column decoder.

(C) Address signals $A'_0$ to $A'_{19}$ for performing external access (reading or writing, for example) are input to an address buffer 60 from the outside. The address signals $A'_0$ and $A'_1$ are assigned to block address signals $A_0$ and $A_1$. Specifically, the least significant address signal $A'_0$ is assigned to the block address signal $A_0$. The next least significant address signal $A'_1$ is assigned to the block address signal $A_1$. One of the blocks A to D in which the memory cell to be accessed externally is disposed is selected based on the block address signals $A_0$ and $A_1$.

The address signals $A'_2$ to $A'_7$ are assigned to column address signals $A_2$ to $A_7$. The column address signals $A_2$ to $A_7$ are input to the column decoders 26A to 26D. The column addresses of the blocks A to D are selected based on the column address signals $A_2$ to $A_7$.

The address signals $A'_8$ to $A'_{19}$ are assigned to row address signals $A_8$ to $A_{19}$. The row address signals $A_8$ to $A_{19}$ are input to row predecoders 30A to 30D as described later. The row addresses of the blocks A to D are selected based on the row address signals $A_8$ to $A_{19}$. The address signals $A'_0$ to $A'_{19}$ are assigned in the order from the block address signals, the column address signals, and the row address signals. However, the order may differ therefrom.

(D) The semiconductor device 1 includes a mode controller 110. An operating state and a standby state are described before describing the mode controller 110. The semiconductor device 1 has an operating state and a standby state. The semiconductor device 1 is accessible externally in the operating state. The semiconductor device 1 is inaccessible externally in the standby state. Refreshing is performed even if the semiconductor device 1 is in the standby state.

The standby state consists of a nonselected state and a power saving state. The nonselected state is the standby state in which the semiconductor device 1 is not selected by a chip select signal /CS although a system including the semiconductor device 1 is being operated, for example. The power saving state is the standby state in which current consumption of the semiconductor device 1 is minimum.

A chip select signal /CS', a snooze signal /ZZ', a write enable signal /WE', and an output enable signal /OE' are input to the mode controller 110 from the outside. A chip select signal /CS, a snooze signal /ZZ, a write enable signal /WE, and an output enable signal /OE which are active low are output from the mode controller 110.

The semiconductor device 1 is in the operating state when the chip select signal /CS is at L level (active) and the snooze signal /ZZ is at H level (non-active). The semiconductor device 1 is in the nonselected state when the chip select signal /CS is at H level (non-active) and the snooze signal /ZZ is at H level (non-active). The semiconductor device 1 is in the power saving state when the chip select signal /CS is at H level (non-active) and the snooze signal /ZZ is at L level (active)

(E) A substrate voltage generating circuit 120 is a circuit for generating a substrate voltage $V_{bb}$ applied to a substrate on which the semiconductor device 1 is formed. In the case where the absolute value of the substrate voltage $V_{bb}$ is decreased, the data holding time of the memory cells is increased in the power saving state, and the data holding time of the memory cells is decreased in the operating state. The length of the refresh cycle can be increased by increasing the data holding time, whereby the power consumption can be decreased. One of the features of the present embodiment is that the power consumption is decreased by causing the refresh cycle in the power saving state to be longer than that in the operating state. This feature is described in detail in the section '3. Refresh cycle'.

(F) An RF (refresh) timing signal generating circuit 70 includes a ring oscillation circuit, and generates an RF (refresh) timing signal. The RF timing signal generating circuit 70 periodically sets the RF timing signal to H level (active). RF (refresh) request signals A to D described below rise to H level (active) based on the rise of the RF timing signal to H level. The cycle of the RF timing signals becomes the refresh cycle. The power consumption is decreased by causing the cycle of the RF timing signal (refresh cycle) in the power saving state to be longer than those in the operating state and the nonselected state. The RF timing signal generating circuit 70 is described in detail in the section '4. RF timing signal generating circuit'.

(G) An RF request signal A generating circuit 50A to an RF request signal D generating circuit 50D are respectively provided corresponding to the blocks A to D, to which the RF timing signal output from the RF timing signal generating circuit 70 is input. The RF request signals A to D are respectively output from the RF request signal A generating circuit 50A to the RF request signal D generating circuit 50D. The RF request signal generating circuits are described in detail in the section '7. RF request signal generating circuit'.

(H) The block address signals $A_0$ and $A_1$ are input to a block select signal generating circuit 80. Block A–D select signals are output from the block select signal generating circuit 80.

In the case where the block address signals ($A_0$, $A_1$) are (L level, L level), the block A select signal at H level (active) and the block B, C, D select signals at L level are output from the block select signal generating circuit 80. The block A is selected based on the block A select signal at H level.

In the case where the block address signals ($A_0$, $A_1$) are (H level, L level), the block B select signal at H level (active) and the block A, C, D select signals at L level are output from the block select signal generating circuit 80. The block B is selected based on the block B select signal at H level.

In the case where the block address signals ($A_0$, $A_1$) are (L level, H level), the block C select signal at H level (active) and the block A, B, D select signals at L level are output from the block select signal generating circuit 80. The block C is selected based on the block C select signal at H level.

In the case where the block address signals ($A_0$, $A_1$) are (H level, H level), the block D select signal at H level (active) and the block A, B, C select signals at L level are output from the block select signal generating circuit 80. The block D is selected based on the block D select signal at H level. The block select signal generating circuit 80 is described in detail in the section '5. Block select signal generating circuit'.

(I) A block A controller 40A to a block D controller 40D are respectively provided corresponding to the blocks A to D. The RF request signals A to D and the block A–D select signals are input to the corresponding block A controller 40A to the block D controller 40D.

The block A controller 40A to the block D controller 40D control the execution of either external access or refreshing in the corresponding blocks A to D. Specifically, the RF request signals A to D at H level (active) are input to the corresponding block controllers at a certain timing. One of the block controllers to which the block select signal at H level (active) is input (block A controller 40A, for example) outputs an external access execution signal A at H level (active). The memory cell in the block corresponding to the above block controller (block A, for example) is accessed externally based on the external access execution signal.

Since the block select signals at L level (non-active) are input to all the remaining block controllers (block B controller 40B, block C controller 40C, and block D controller 40D, for example), the refresh execution signals at H level (active) are output from these block controllers. The memory cells in a specific row are refreshed in the blocks corresponding to the remaining block controllers (block B, block C, and block D, for example) based on these refresh execution signals. The block controllers are described in detail in the section '6. Block controller'.

(J) The RF request signals A to D output from the RF request signal A generating circuit 50A to the RF request signal D generating circuit 50D are input to an RF counter controller 90. The RF counter controller 90 outputs a count-up signal. The count-up signal is input to an RF counter 100. The RF counter controller 90 is described in detail in the section '9. RF counter controller'.

(K) The RF counter 100 has the same structure as that of a conventional counter. Refresh address signals $RFA_8$ to $RFA_{19}$ are output from the RF counter 100. The refresh address signals $RFA_8$ to $RFA_{19}$ are input to the row predecoders 30A to 30D. A plurality of memory cells in a row which must be refreshed is selected in the blocks A to D based on the refresh address signals $RFA_8$ to $RFA_{19}$.

(L) The row predecoders 30A to 30D supply signals for driving the word line to the corresponding row decoders 24A to 24D. The operations of the row predecoders 30A to 30D are as follows. The refresh address signals $RFA_8$ to $RFA_{19}$ output from the RF counter 100 and the row address signals $A_8$ to $A_{19}$ output from the address buffer 60 are input to the row predecoders 30A to 30D. For example, in the case where the block A is accessed externally, the external access execution signal A at H level (active) is input to the Row predecoder 30A, and the RF execution signals B, C, and D at H level (active) are input to the row predecoders 30B to 30D. This allows the row predecoder 30A to supply a signal for driving the word line which selects the memory cell to be accessed externally to the row decoder 24A. The row predecoders 30B to 30D supply signals for driving the word line which selects the memory cells in a row to be refreshed to the row decoders 24B to 24D, respectively. The row predecoders 30A to 30D are described in detail in the section '8. Row predecoder'.

(M) The semiconductor device 1 includes a clock 130. A clock signal output from the clock 130 becomes a standard signal for the operations of the semiconductor device 1 such as external access and refreshing.

2. Refresh operation of semiconductor device

External access (reading or writing of data, for example) to the semiconductor device 1 is the same as that in a conventional SRAM (static random access memory). Therefore, description thereof is omitted. The refresh operations of the semiconductor device 1 are described below separately for the operating state, the nonselected state, and the power saving state.

2.1 Operating state

Figure 2:
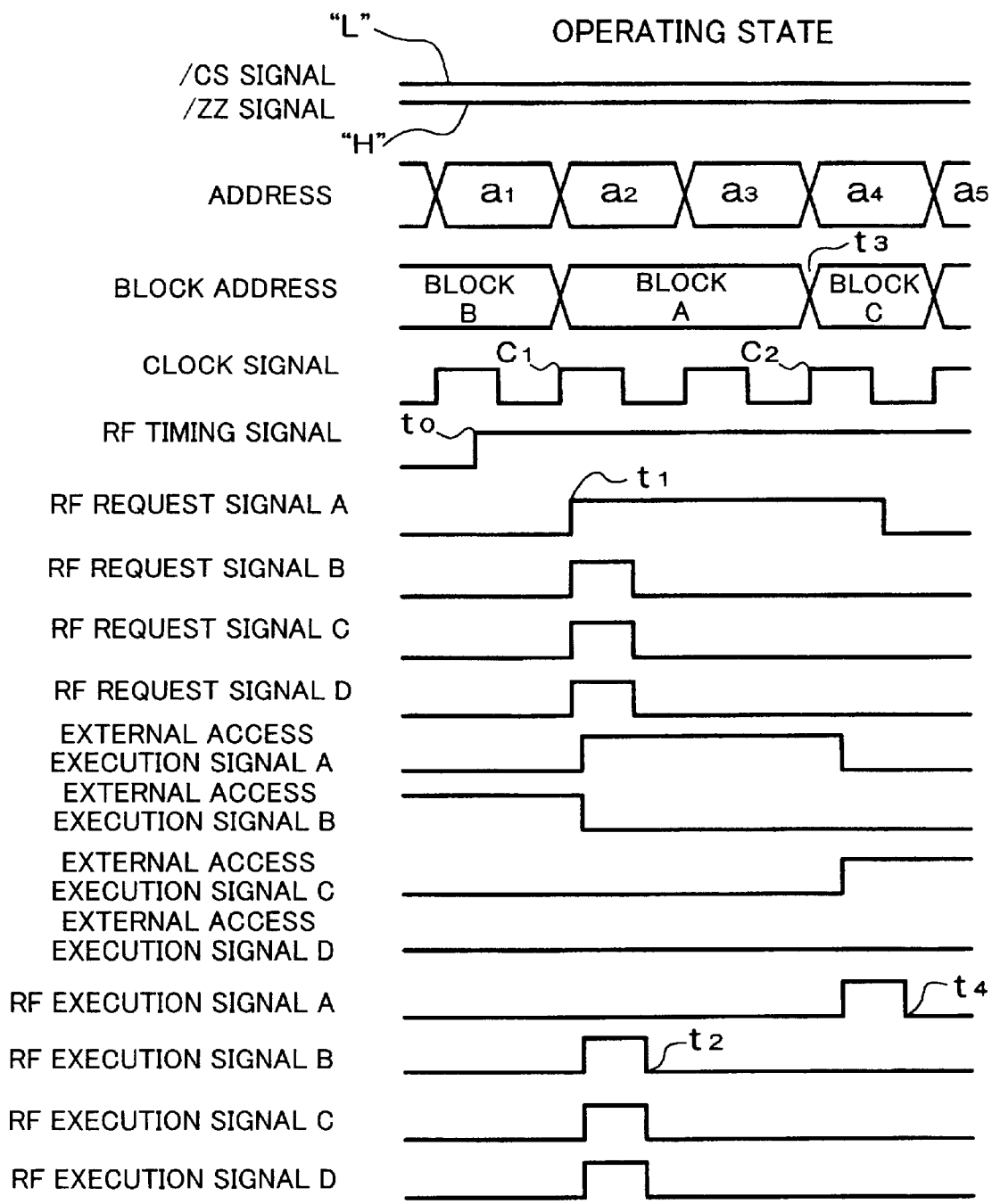
FIG. 2 is a timing chart for describing an operating state of the semiconductor device according to the present embodiment.

The refresh operations of the semiconductor device 1 in the operating state are described below with reference to FIGS. 1 and 2. FIG. 2 is a timing chart for describing the operating state of the semiconductor device 1. The semiconductor device 1 is in the operating state since the chip select signal /CS is at L level and the snooze signal /ZZ is at H level.

The address is an address of the memory cell to be accessed externally. The address is specified by the block address signals $A_0$ and $A_1$, the column address signals $A_2$ to $A_7$, and the row address signals $A_8$ to $A_{19}$.

The block address is an address of the block to be selected (specifically, the block to which the memory cell to be accessed externally belongs). For example, an address $a_1$ exists in the block B, addresses $a_2$ and $a_3$ exist in the block A, and an address $a_4$ exists in the block C.

The RF timing signal rises to H level (active) at time $t_0$. The RF request signals A to D rise to H level (active) based on a first clock signal ($c_1$) in a state in which the RF timing signal is at H level (time $t_1$). The mechanism is described in the section '7.1 Operations in operating state and nonselected state' in '7. RF request signal generating circuit'.

The block A is selected at time $t_1$. The external access execution signal A at H level (active) is output from the block A controller 40A based on the clock signal ($c_1$) and the selection of the block A. The RF execution signals B, C, and D are output from the remaining block controllers based on the clock signal $c_1$ and the RF request signals B, C, and D. The mechanism is described in the section '6. Block controller'.

After time $t_1$, the memory cell which must be accessed externally (this memory cell is located in block A) is accessed externally by the external access execution signal A. Specifically, the external access (reading or writing, for example) operation is performed for the memory cell selected by the row decoder 24A and the column decoder 26A. In the remaining blocks, the memory cells in a row to be refreshed (n-th row, for example) are refreshed by the RF execution signals B, C, and D. The mechanism is described in the section '8. Row predecoder'.

After a period of time needed for refreshing has elapsed, the RF request signals B, C, and D fall to L level (non-active). This allows the RF request signals B, C, and D to fall to L level (non-active), whereby refreshing is completed (time $t_2$). The mechanism is described in the section '6. Block controller'.

Refreshing of the memory cells in the n-th row which must be refreshed is delayed in the block A during a period in which the block A is selected by the block address. When the block address is changed from the block A to another block, the memory cells in the n-th row which must be refreshed are refreshed in the block A. This is described below in detail. The block address is changed from the block A to the block C at time $t_3$ (generation of clock signal ($c_2$)). Since the RF request signal A is at H level (active), the RF execution signal A at H level is output from the block A controller 40A based on the clock signal ($c_2$) and the RF request signal A at H level. This allows the memory cells in the same row as the row which has refreshed in other blocks during a period in which the block A is selected (n-th row) to be refreshed in the block A. After a period of time needed for refreshing has elapsed, the RF request signal A falls to L level. This allows the RF request signal A to fall to L level, whereby refreshing is completed (time $t_4$).

Refreshing of the memory cells selected by the word lines in the n-th row in the blocks A to D in the operating state is thus completed.

The word lines in the n-th row in the blocks A to D have the following two meanings. Either of these may be applied to the present embodiment. The word lines according to the first meaning are located at the same geometrical position in the blocks A to D. The word lines according to the second meaning are located in the same row in the address space in the blocks A to D, specifically, the same row with respect to the block controllers. In the case of the second meaning, the geometrical positions of the word lines in the n-th row in the blocks A to D are not necessarily the same.

2.2 Nonselected State

Figure 3:
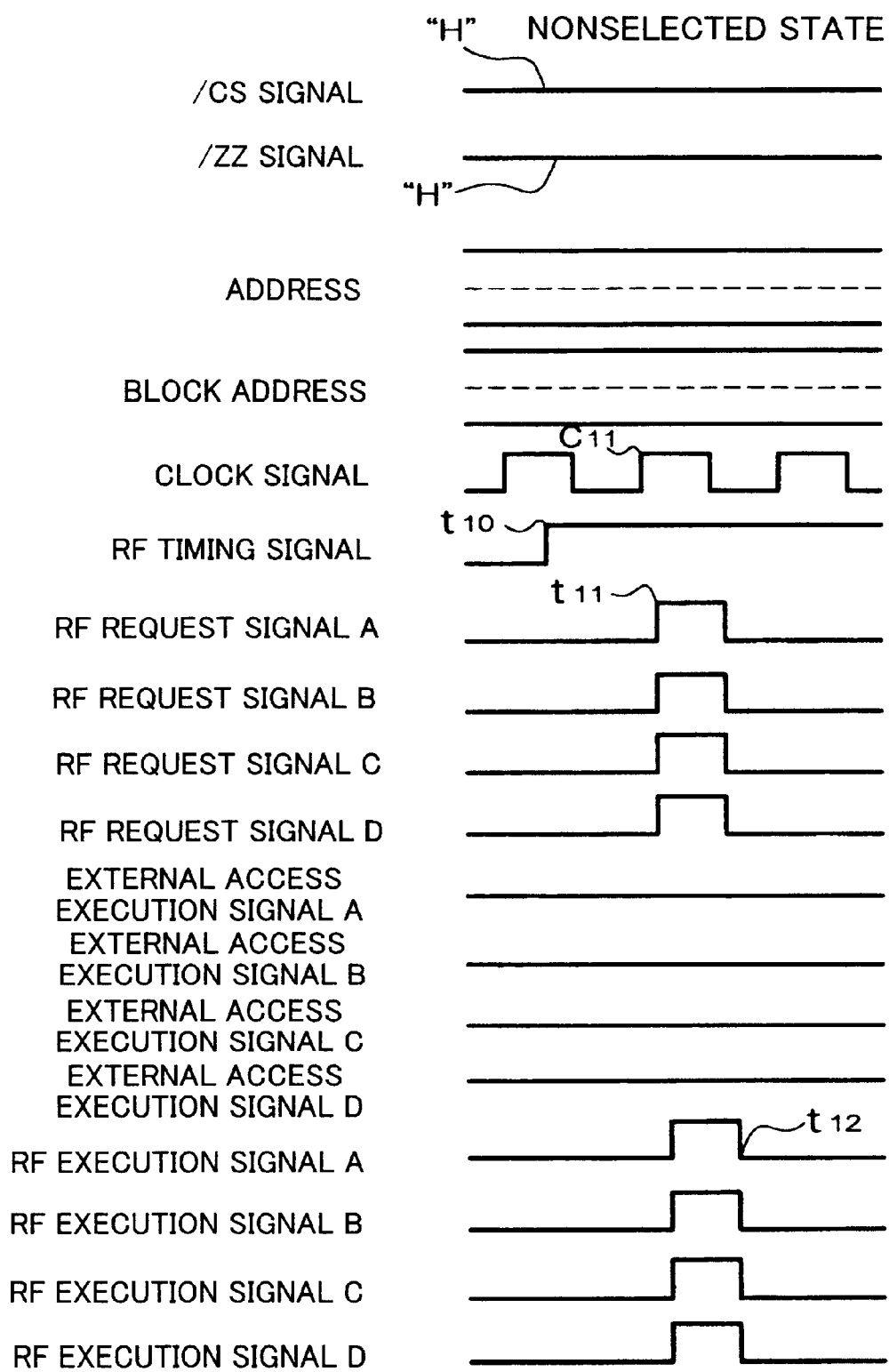
FIG. 3 is a timing chart for describing a nonselected state of the semiconductor device according to the present embodiment.

The refresh operations of the semiconductor device 1 in the nonselected state are described below with reference to FIGS. 1 and 3. FIG. 3 is a timing chart for describing the nonselected state of the semiconductor device 1. The semiconductor device 1 is in the nonselected state since the chip select signal /CS is at H level and the snooze signal /ZZ is at H level.

The RF timing signal rises to H level at time $t_{10}$. The RF request signals A to D rise to H level (active) based on the first leading edge of the clock signal ($c_{11}$) after the RF timing signal rises to H level (time $t_{11}$). The mechanism is described in the section '7.1 Operations in operating state and nonselected state' in '7. RF request signal generating circuit'.

Since none of the blocks A to D is selected in the nonselected state, the RF execution signals A to D at H level are output from the block A controller 40A to block D controller 40D. This allows the memory cells in a row which must be refreshed to be refreshed in the blocks A to D. After a period of time needed for refreshing has elapsed, the RF request signals A to D fall to L level. This allows the RF execution signals A to D to fall to L level, whereby refreshing is completed (time $t_{12}$).

Refreshing of the memory cells connected to the word line in a row which must be refreshed (n-th row, for example) in the blocks A to D in the nonselected state is thus completed.

2.3 Power Saving State

Figure 4:
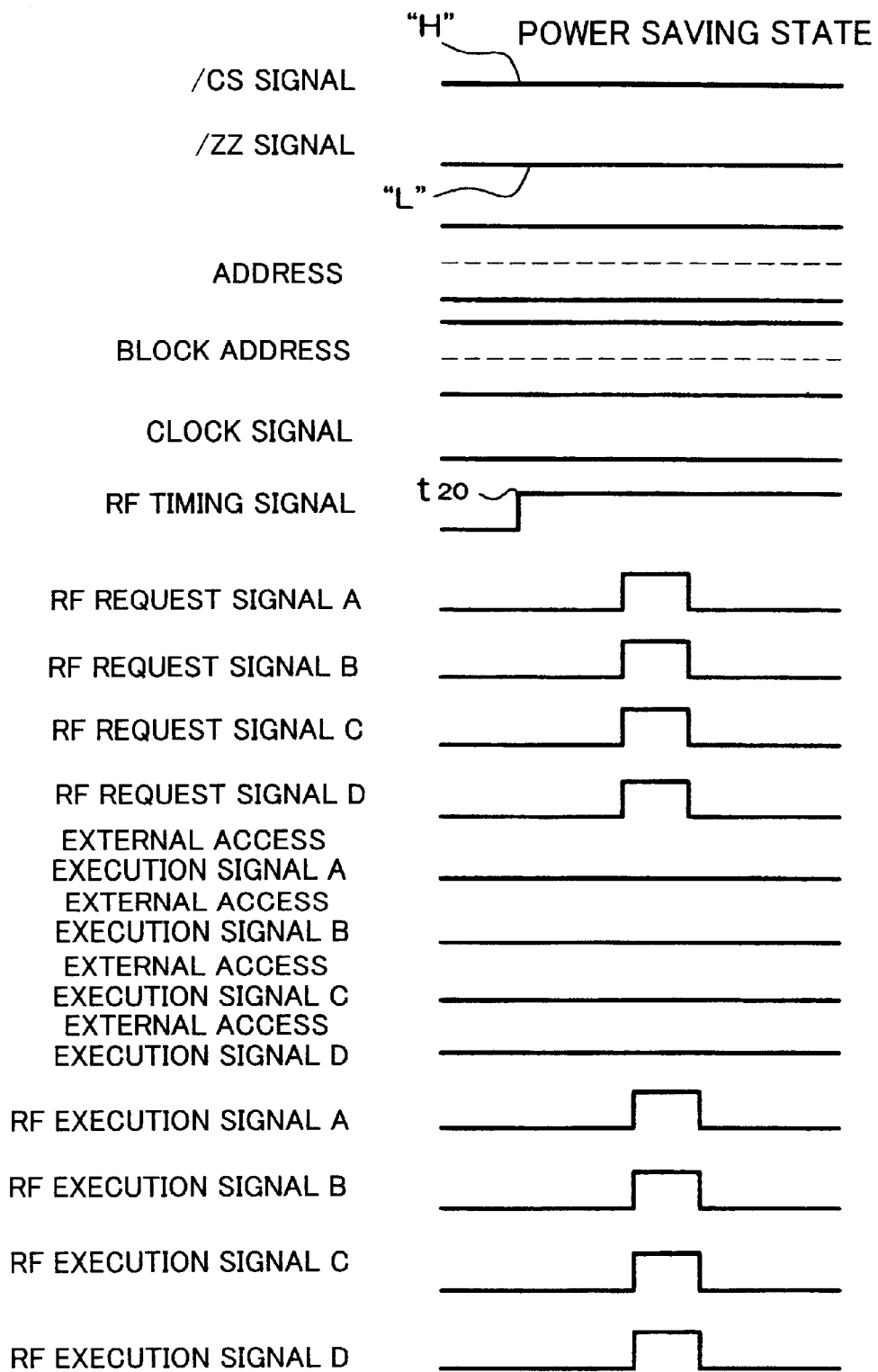
FIG. 4 is a timing chart for describing a power saving state of the semiconductor device according to the present embodiment.

The refresh operations of the semiconductor device 1 in the power saving state are described below with reference to FIGS. 1 and 4. FIG. 4 is a timing chart for describing the power saving state of the semiconductor device 1. The semiconductor device 1 is in the power saving state since the chip select signal /CS is at H level and the snooze signal /ZZ is at L level.

The clock signal is terminated in the power saving state. Therefore, refreshing is performed based on the rise of the RF timing signal. Specifically, the RF timing signal rises to H level (active) at time $t_{20}$. This allows the RF request signals A to D to rise to H level (active). The mechanism is described in the section '7.2 Operations in power saving state' in '7. RF request signal generating circuit'. Operations thereafter are the same as the operations after time $t_{11}$ described in '2.2 Nonselected state'.

The refresh operations of the semiconductor device 1 are described above. In the present embodiment, the memory cells selected by the word line in the n-th row are refreshed in each of the blocks A to D. The memory cells selected by the word line in the (n+1) th row are then refreshed in each of the blocks A to D. After the memory cells selected by the word line in the final row (4095th row in the present embodiment) have been refreshed, the memory cells selected by the word line in the first row (0th row) are refreshed. This series of operations is repeatedly performed. The cycle of these operations is called a refresh cycle. The refresh cycle is a period of time from one leading edge of the RF timing signal to the next leading edge of the RF timing signal (see FIG. 20), for example.

The major effects of the present embodiment are described below. In the present embodiment, during a period of time in which one block (block A, for example) is accessed externally in the operating state, the memory cells in a row which must be refreshed are refreshed in all the remaining blocks (blocks B, C, and D, for example), as shown in FIG. 2. Therefore, the semiconductor device 1 can be operated efficiently.

In the present embodiment, the blocks A to D are selected by the block address signals $A_0$ and $A_1$. Specifically, among the external address signals $A'_0$ to $A'_{19}$, lower order address signals are assigned to the block address signals. Since the address signals frequently change as the order becomes lower, the block accessed externally always tends to be changed. Therefore, assigning the block address signals in this manner can prevent refreshing from being continuously delayed in one block. Therefore, refresh reliability in all the blocks can be increased.

3. Refresh Cycle

One of the features of the present embodiment is that the refresh cycle in the power saving state is caused to be longer than the refresh cycle in the operating state. This limits the power consumption in the power saving state, whereby the power consumption can be decreased. This feature is described below in detail.

(A) The memory cells in the memory cell array 20 must be refreshed for holding data. The semiconductor device 1 performs operations for refreshing specific memory cells, and then performs operations for refreshing other specific memory cells. These operations are cyclically performed, whereby all memory cells are refreshed. This cycle is called a refresh cycle, which is determined taking into consideration a period of time in which the memory cells can hold data. The power consumption can be decreased by increasing the length of the refresh cycle. However, if the length of the refresh cycle is increased excessively, the memory cells cannot hold data. Refreshing is necessary even if the semiconductor device 1 is in the power saving state. In the power saving state, electric power is consumed mainly for refreshing.

Figure 5:
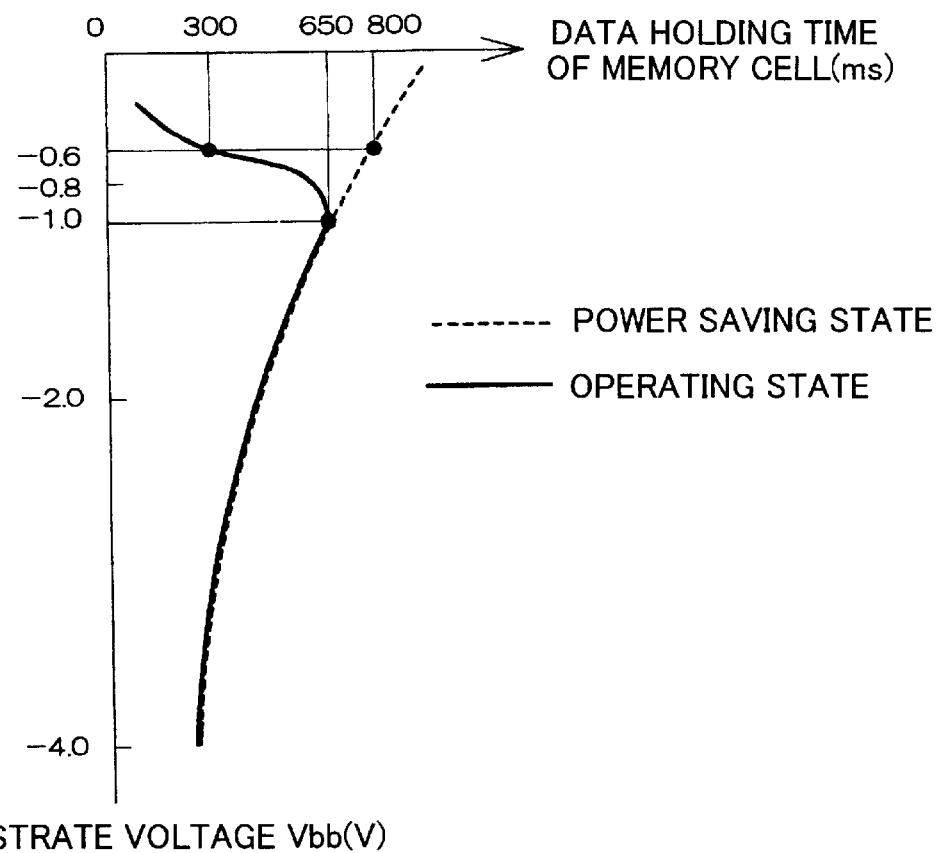
FIG. 5 is a graph showing an example of the relation between the data holding time (ms) of memory cells and a substrate voltage $V_{bb}$ (V).

(B) In the case where the absolute value of the substrate voltage $V_{bb}$ of the substrate voltage generating circuit 120 is decreased, the data holding time of the memory cells is increased in the power saving state, and the data holding time of the memory cells is decreased in the operating state. This is described below in detail. FIG. 5 is a graph showing an example of the relation between the data holding time (ms) of the memory cells and the substrate voltage $V_{bb}$ (V). Each memory cell consists of an n-type MOS transistor and a capacitor. In the case of an n-type MOS transistor, the substrate voltage $V_{bb}$ is negative. In the case of a p-type MOS transistor, the substrate voltage $V_{bb}$ is positive. A solid line indicates the relation in the operating state, and a dotted line indicates the relation in the power saving state.

Figure 6:
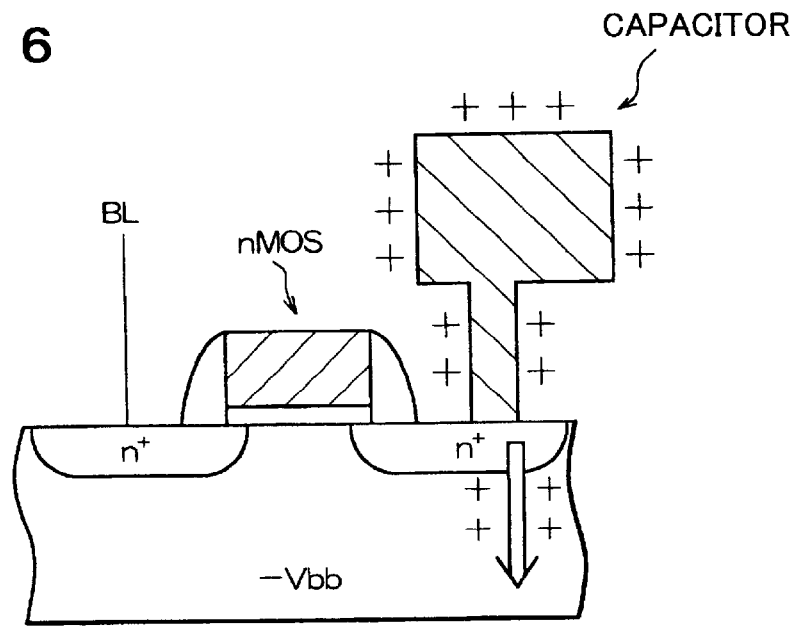
FIG. 6 is a cross-sectional view showing the memory cell in the power saving state.

In the power saving state, the data holding time of the memory cells increases as the absolute value of the substrate voltage $V_{bb}$ is decreased, as described above. The reasons therefor are described below with reference to FIG. 6. FIG. 6 is a cross-sectional view showing the memory cell in the power saving state, in which a leakage path for charges stored in the capacitor is illustrated. Since the substrate voltage $V_{bb}$ is negative, charges stored in the capacitor barely leak as the absolute value of the substrate voltage $V_{bb}$ is decreased. Therefore, the data holding time of the memory cells can be increased.

Figure 7:
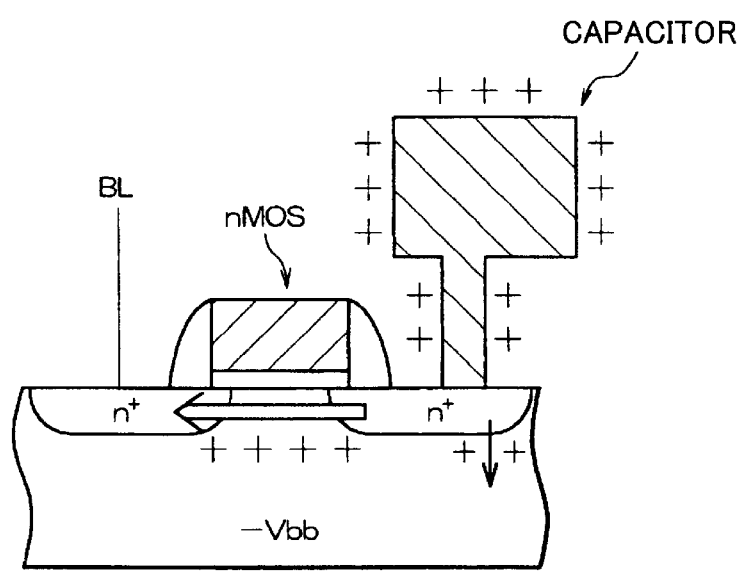
FIG. 7 is a cross-sectional view showing the memory cell in the operating state.

In the operating state, the data holding time increases as the absolute value of the substrate voltage $V_{bb}$ is decreased until the absolute value of the substrate voltage $V_{bb}$ becomes a specific value (−1.0 V in this example), as indicated by the solid line shown in FIG. 5. However, the data holding time decreases when the absolute value of the substrate voltage $V_{bb}$ is decreased to less than the specific value (−1.0 V in this example). The reasons therefor are described below with reference to FIG. 7. FIG. 7 is a cross-sectional view showing the memory cell in the operating state, in which the leakage path for charges stored in the capacitor is illustrated. Charges stored in the capacitor barely leak into the substrate as the absolute value of the substrate voltage $V_{bb}$ is decreased in the same manner as described above. However, the threshold value ($V_{th}$) of the nMOS transistor decreases when the absolute value of the substrate voltage $V_{bb}$ is decreased to less than the specific value. Therefore, when the potential of the bit line BL becomes a ground potential in the operating state, charges stored in the capacitor tend to leak into impurity regions connected to the bit line BL. Therefore, if the absolute value of the substrate voltage $V_{bb}$ is set too small, the data holding time of the memory cells decreases.

(C) Therefore, in the case where there is only one refresh cycle, the refresh cycle must be determined based on the time at which the solid line (operating state) and the dotted line (power saving state) shown in FIG. 5 intersect, and the data holding time is the longest (−1.0 V in this example). Therefore, the length of the refresh cycle in the power saving state cannot be increased by decreasing the absolute value of the substrate voltage $V_{bb}$.

In the present embodiment, since the refresh cycle in the power saving state is caused to differ from the refresh cycle in the operating state, the substrate voltage $V_{bb}$ can be decreased to −0.6 V to 0.8 V, of which the absolute values are smaller than −1.0 V. For example, the data holding time in the power saving state is 800 ms in the case of −0.6 V, whereby the length of the refresh cycle in the power saving state can be increased. Since the data holding time in the operating state is 300 ms in the case of −0.6 V, the length of the refresh cycle must be decreased in the operating state. However, portable equipment is in the operating state for only a short period of time in one day (30 minutes, for example). Portable equipment is in the power saving state for the greatest part of the day (24 hours to 30 minutes, for example). Therefore, according to the present invention by which the power consumption in the power saving state can be limited, the power consumption can be decreased.

In the present embodiment, the refresh cycle in the nonselected state is caused to be the same as the refresh cycle in the operating state. However, the refresh cycle in the nonselected state may be the same as the refresh cycle in the power saving state. The present invention can be applied to a case where the access transistor of the memory cell is a p-type MOS transistor.

4. RF Timing Signal Generating Circuit

The RF timing signal generating circuit 70 is described below. As described in the section '3. Refresh cycle', the power consumption is decreased by causing the refresh cycle in the power saving state to be longer than the refresh cycle in the operating state. In the present embodiment, refreshing is started at the leading edge of the RF timing signal, and the cycle of the RF timing signal is employed as the refresh cycle.

Therefore, the refresh cycle in the power saving state can be set longer than the refresh cycle in the operating state, by causing the cycle of the RF timing signal in the power saving state to be longer than the cycle of the RF timing signal in the operating state. This feature can be achieved by the RF timing signal generating circuit 70. The following two types can be given as examples of the RF timing signal generating circuit 70.

Type 1

Figure 8:
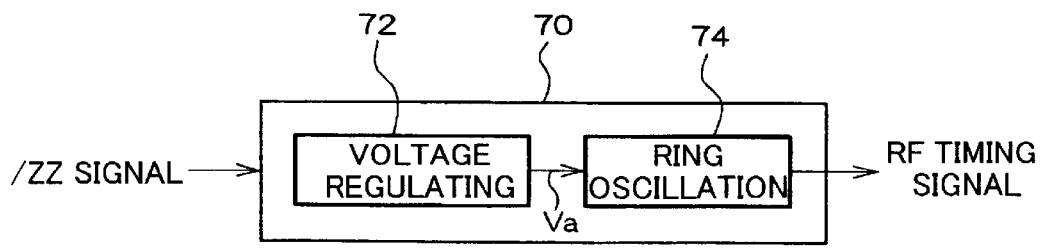
FIG. 8 is a block diagram showing an RF timing signal generating circuit of a type 1 provided in the semiconductor device according to the present embodiment.
Figure 9:
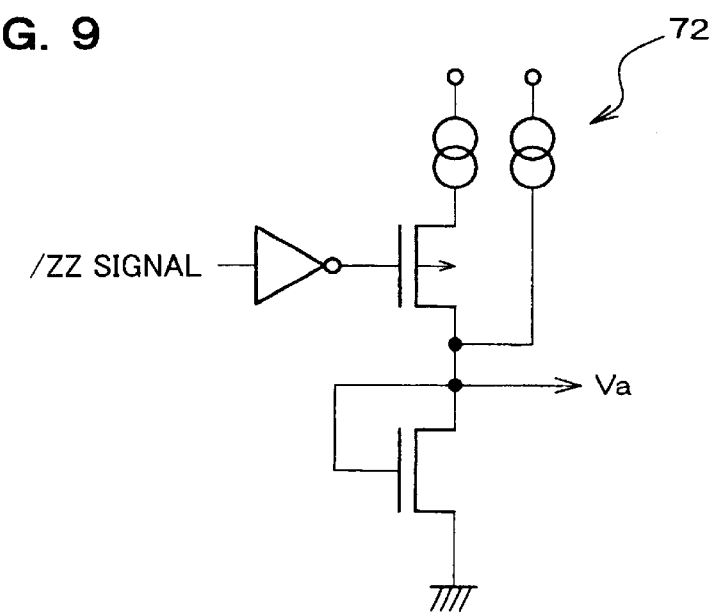
FIG. 9 is a circuit diagram showing a voltage regulating circuit provided in the RF timing signal generating circuit of type 1.
Figure 10:
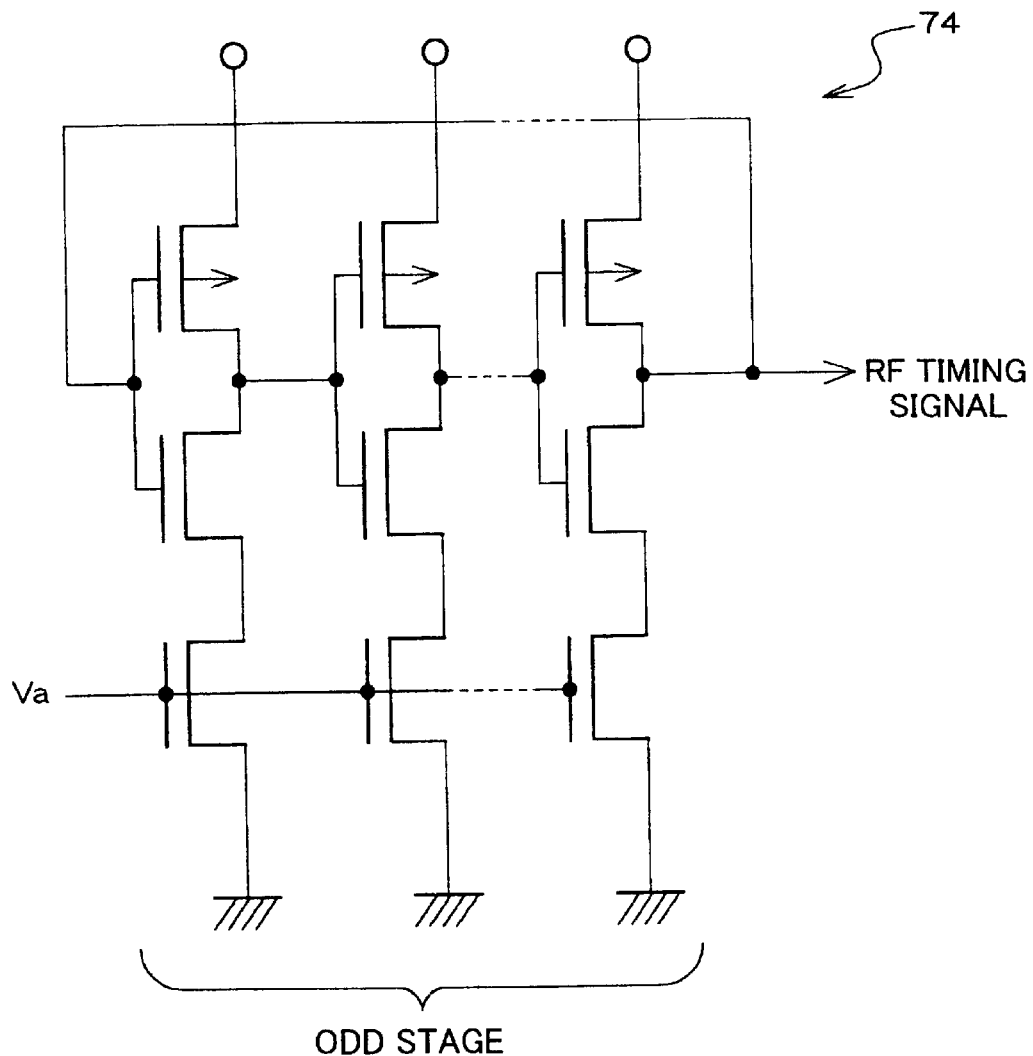
FIG. 10 is a circuit diagram showing a ring oscillation circuit provided in the RF timing signal generating circuit of the type 1.

FIG. 8 shows the RF timing signal generating circuit 70 of type 1. The RF timing signal generating circuit 70 includes a voltage regulating circuit 72 and a ring oscillation circuit 74. FIG. 9 is a circuit diagram showing an example of the voltage regulating circuit 72. FIG. 10 is a circuit diagram showing an example of the ring oscillation circuit 74. A pulse signal generated from the ring oscillation circuit 74 becomes the RF timing signal which is an output signal of the RF timing signal generating circuit 70.

Figure 11:
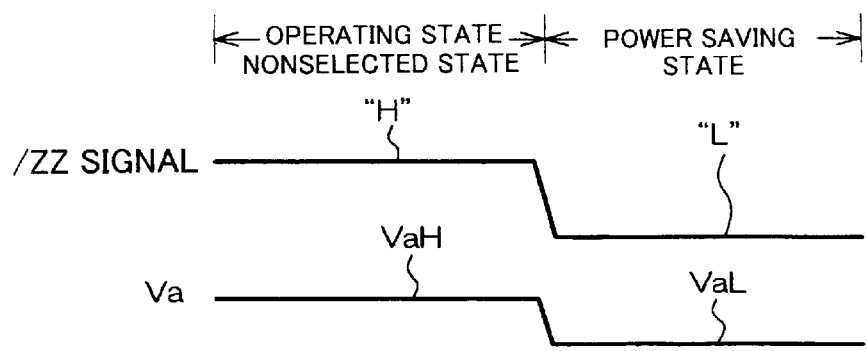
FIG. 11 is a waveform diagram showing the relation between a voltage $V_a$ from the voltage regulating circuit and a snooze signal /ZZ.

The snooze signal /ZZ output from the mode controller 110 is input to the voltage regulating circuit 72. A voltage $V_a$ output from the voltage regulating circuit 72 is $V_aH$ when the snooze signal /ZZ is at H level (operating state and nonselected state), as shown in FIG. 11. When the snooze signal /ZZ is at L level (power saving state), the voltage $V_a$ is $V_aL$, which is smaller than $V_aH$. The cycle of the RF timing signal output from the ring oscillation circuit 74 shown in FIG. 10 is changed by the voltage $V_a$ output from the voltage regulating circuit 72. Specifically, the cycle of the RF timing signal is longer when the voltage $V_a$ is $V_aL$ in comparison with the case of $V_aH$. Specific values for the cycle of the RF timing signal are described below.

Figure 12:
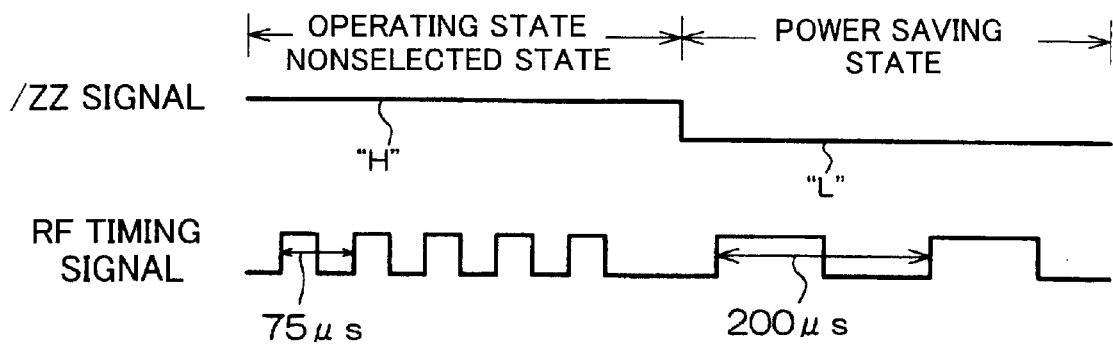
FIG. 12 is a waveform diagram showing the relation between an RF timing signal and the snooze signal /ZZ in the RF timing signal generating circuit of the type 1.

In the present embodiment, when the snooze signal /ZZ is at H level (operating state and nonselected state), the signal output from the ring oscillation circuit 74 becomes the RF timing signal with a cycle of 75 μs as shown in FIG. 12, for example.

When the snooze signal /ZZ is at L level (power saving state), the signal output from the ring oscillation circuit 74 becomes the RF timing signal with a cycle of 200 μs as shown in FIG. 12, for example.

The 75 μs and 200 μs cycles are calculated from the case where the substrate voltage $V_{bb}$ is −0.6 V in the example shown in FIG. 5. Specifically, the data holding time of the memory cells in the operating state is 300 ms. 0 to 4095 rows exist in each of the blocks A to D shown in FIG. 1 (number of word lines is 4096), and the number of refresh cycles is about 4000. The cycle of the RF timing signal (refresh cycle) is as follows.

Cycle of RF timing signal=300 $ms$÷4000=75 $\mu s$

Since the data holding time in the power saving state is 800 ms, the cycle of the RF timing signal (refresh cycle) is as follows.

Cycle of RF timing signal=800 $ms$÷4000=200 $\mu s$

Type 2

Figure 13:
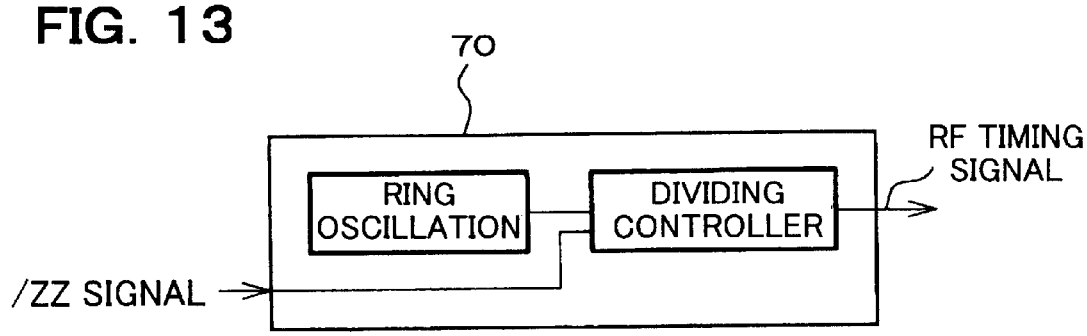
FIG. 13 is a block diagram showing an RF timing signal generating circuit of a type 2 provided in the semiconductor device according to the present embodiment.

FIG. 13 shows the RF timing signal generating circuit 70 of type 2. The RF timing signal generating circuit 70 includes a ring oscillation circuit and a dividing controller. A pulse signal generated from the ring oscillation circuit is input to the dividing controller. The pulse signal output from the dividing controller becomes the RF timing signal which is an output signal from the RF timing signal generating circuit 70. The snooze signal /ZZ output from the mode controller 110 is input to the dividing controller.

Figure 14:
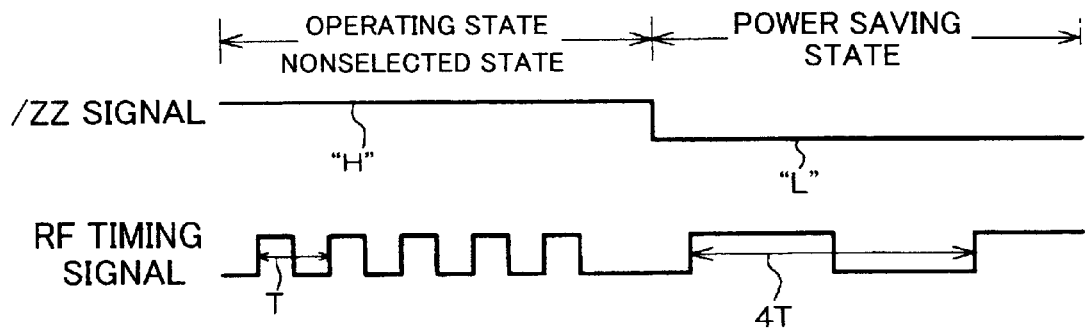
FIG. 14 is a waveform diagram showing the relation between the RF timing signal and the snooze signal /ZZ in the RF timing signal generating circuit of the type 2.

When the snooze signal /ZZ is at H level (operating state and nonselected state), the signal output from the ring oscillation circuit becomes the RF timing signal with a cycle T (75 μs, for example) by the dividing controller, as shown in FIG. 14. When the snooze signal /ZZ is at L level (power saving state), the signal output from the ring oscillation circuit becomes the RF timing signal with a cycle 4T, which is longer than the cycle T, by the dividing controller, for example.

Although the dividing controller is provided inside the RF timing signal generating circuit 70, the dividing controller may be provided outside the RF timing signal generating circuit 70.

5. Block Select Signal Generating Circuit

Figure 15:
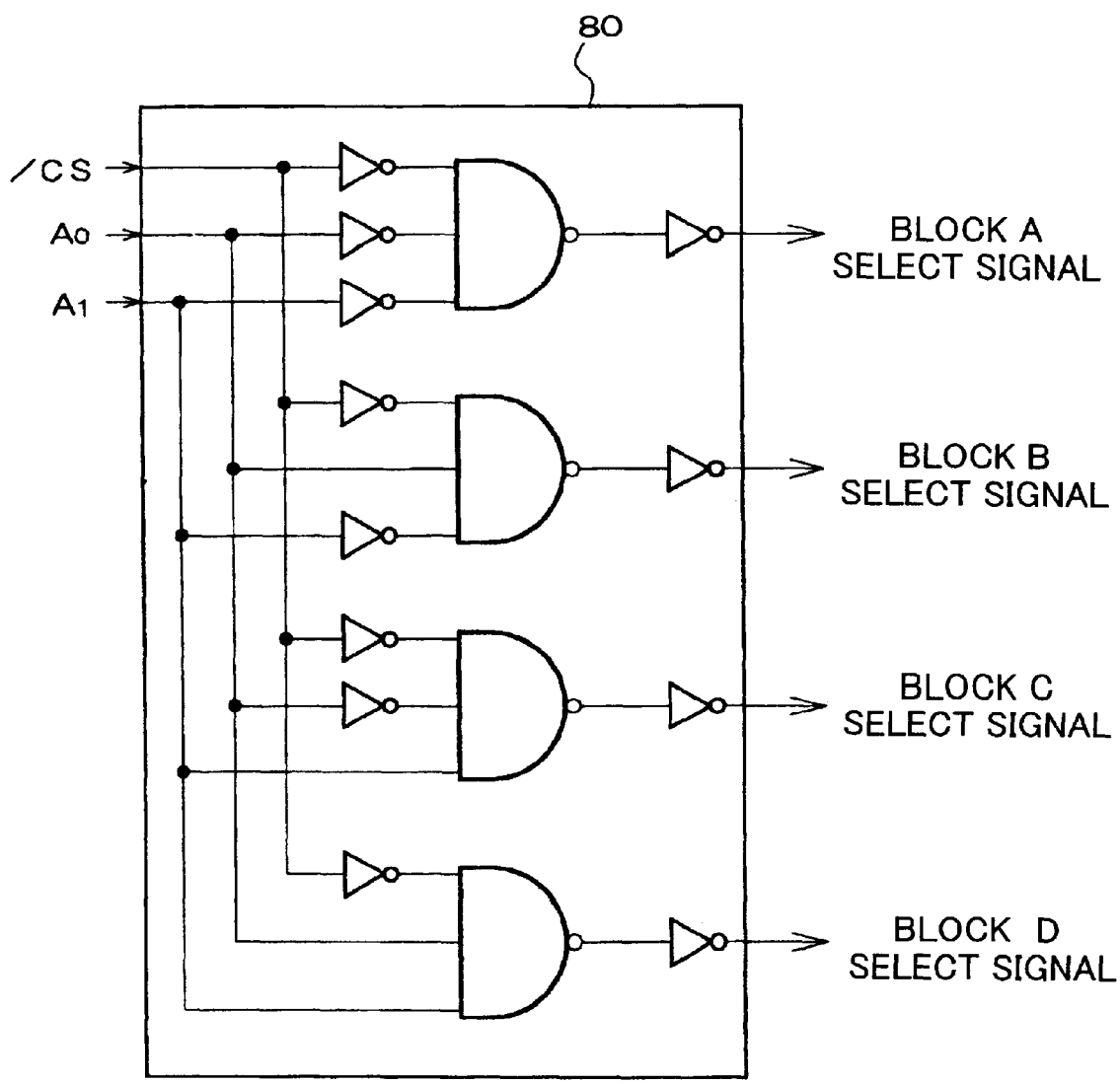
FIG. 15 is a circuit block diagram showing a block select signal generating circuit provided in the semiconductor device according to the present embodiment.

The block select signal generating circuit 80 is described below in detail with reference to FIG. 15. FIG. 15 is a circuit block diagram showing the block select signal generating circuit 80. The chip select signal/CS and the block address signals $A_0$ and $A_1$ are input to the block select signal generating circuit 80. The block A–D select signals are output from the block select signal generating circuit 80. The logic circuits of the block select signal generating circuit 80 are configured so that the following conditions (A) to (E) are satisfied.

(A) In the case where the chip select signal /CS is at L level and the block address signals ($A_0$, $A_1$) are (L level, L level), the block A select signal at H level (active), and the block B select signal, the block C select signal, and the block D select signal at L level (non-active) are output from the block select signal generating circuit 80.

(B) In the case where the chip select signal /CS is at L level and the block address signals ($A_0$, $A_1$) are (H level, L level), the block B select signal at H level (active), and the block A select signal, the block C select signal, and the block D select signal at L level (non-active) are output from the block select signal generating circuit 80.

(C) In the case where the chip select signal /CS is at L level and the block address signals ($A_0$, $A_1$) are (L level, H level), the block C select signal at H level (active), and the block A select signal, the block B select signal, and the block D select signal at L level (non-active) are output from the block select signal generating circuit 80.

(D) In the case where the chip select signal /CS is at L level and the block address signals ($A_0$, $A_1$) are (H level, H level), the block D select signal at H level (active), and the block A select signal, the block B select signal, and the block C select signal at L level (non-active) are output from the block select signal generating circuit 80.

(E) In the case where the chip select signal /CS is at H level, the block A select signal, the block B select signal, the block C select signal, and the block D select signal at L level (non-active) are output from the block select signal generating circuit 80.

6. Block Controller

Figure 16:
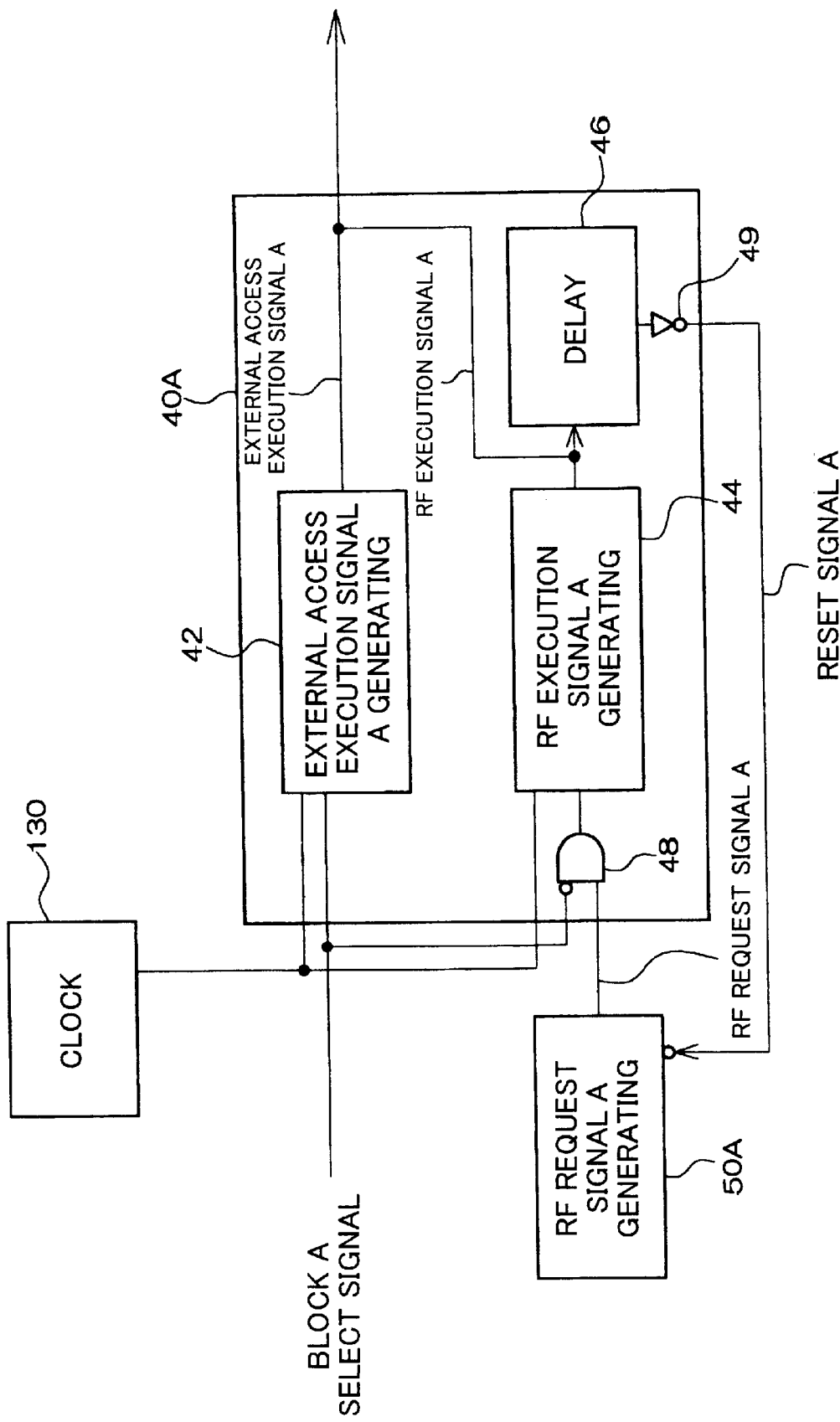
FIG. 16 is a circuit block diagram showing a block A controller and circuits relating to the block A controller provided in the semiconductor device according to the present embodiment.

The block controllers are described below in detail taking the block A controller 40A as an example. FIG. 16 is a circuit block diagram showing the block A controller 40A and circuits relating to the block A controller 40A. The block A controller 40A includes an external access execution signal A generating circuit 42, an RF execution signal A generating circuit 44, a delay circuit 46, an AND gate 48, and an inverter 49.

The operations in the case where the block A is selected (accessed externally) are described below. In this case, the block A select signal at H level (active) and the RF request signal A at H level (active) are input to the block A controller 40A.

This allows the block A select signal at H level and the RF request signal A at H level to be input to the AND gate 48. This allows a signal at L level to be output from the AND gate 48, and input to the RF execution signal A generating circuit 44.

The block A select signal at H level is input to the external access execution signal A generating circuit 42.

The clock signal output from the clock 130 is input to the external access execution signal A generating circuit 42 and the RF execution signal A generating circuit 44. Since the block A select signal at H level is input to the external access execution signal A generating circuit 42, the external access execution signal A at H level (active) is output from the external access execution signal A generating circuit 42 based on the clock signal. Since the signal at L level output from the AND gate 48 is input to the RF execution signal A generating circuit 44, the RF execution signal A at L level (non-active) is output from the RF execution signal A generating circuit 44. The external access execution signal A at H level becomes the output signal of the block A controller 40A.

The operations in the case where the block A is not selected (not accessed externally) are described below. The block A select signal at L level (non-active) and the RF request signal A at H level (active) are input to the block A controller 40A.

This allows the block A select signal at L level and the RF request signal A at H level to be input to the AND gate 48. This allows a signal at H level to be output from the AND gate 48, and input to the RF execution signal A generating circuit 44.

The block A select signal at L level is input to the external access execution signal A generating circuit 42.

The clock signal output from the clock 130 is input to the external access execution signal A generating circuit 42 and the RF execution signal A generating circuit 44. Since the signal at H level output from the AND gate 48 is input to the RF execution signal A generating circuit 44, the RF execution signal A at H level (active) is output from the RF execution signal A generating circuit 44 based on the clock signal. Since the block A select signal at L level is input to the external access execution signal A generating circuit 42, the external access execution signal A at L level (non-active) is output from the external access execution signal A generating circuit 42. The RF execution signal A at H level (active) becomes the output signal of the block A controller 40A.

The RF execution signal A is also input to the delay circuit 46. Therefore, the RF execution signal A at H level is also input to the delay circuit 46. The delay circuit 46 outputs a reset signal A at H level after a period of time needed for refreshing (20–40 ns, for example) has elapsed. This reset signal A is inverted by the inverter 49 to become the reset signal A at L level, and input to a reset (/R) of the RF request signal A generating circuit 50A. As a result, the RF request signal A falls to L level (non-active). This allows the RF execution signal A to fall to L level (non-active), whereby refreshing is completed.

Other block controllers have the same structure as that of the block A controller 40A, and operate in the same manner as the block A controller 40A. As described above, in the present embodiment, generation of the external access execution signal (H level) from one of the block controllers is synchronized with generation of the RF execution signals (H level) from all the remaining block controllers based on the clock signal in the operation cycle.

7. RF Request Signal Generating Circuit

Figure 17:
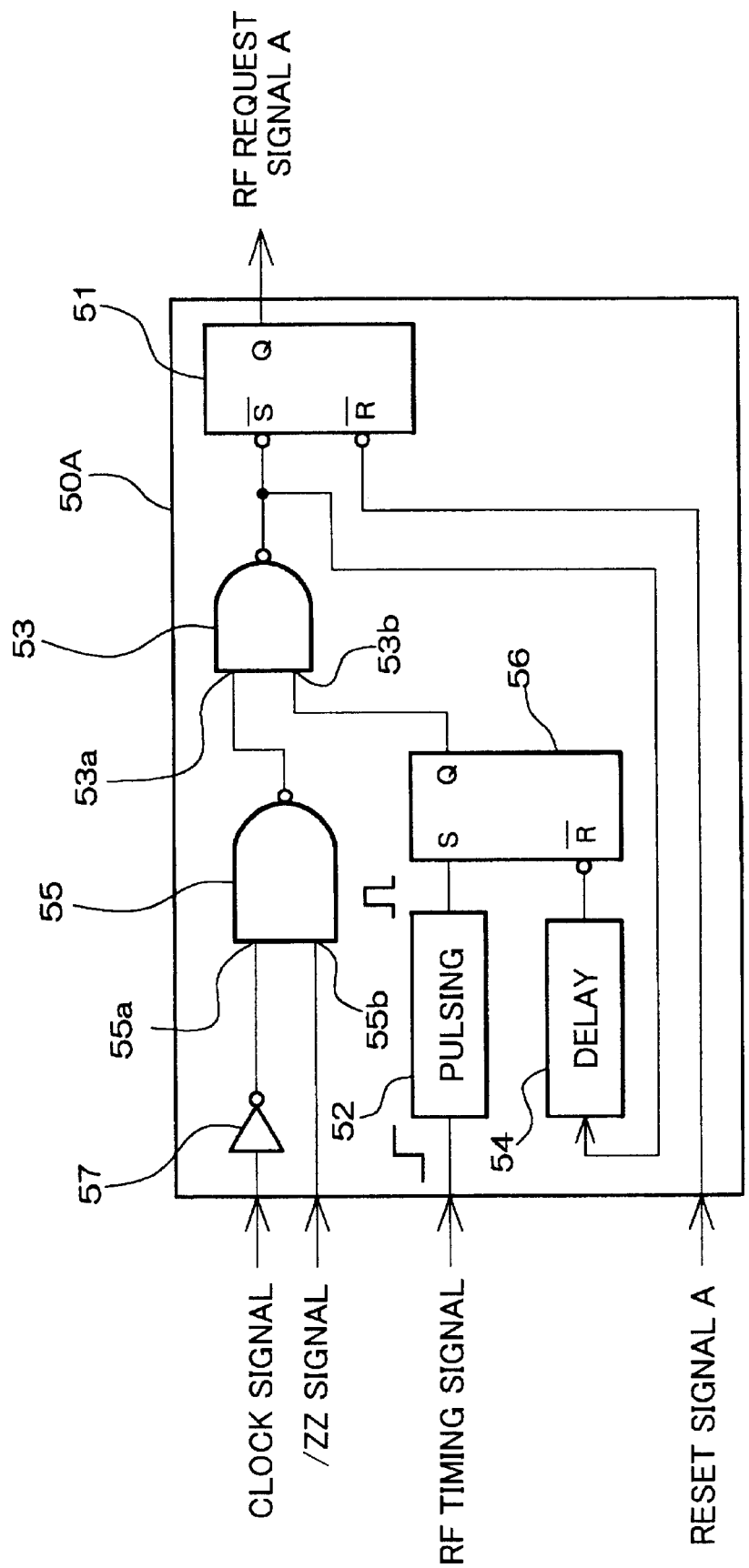
FIG. 17 is a circuit block diagram showing an RF request signal A generating circuit provided in the semiconductor device according to the present embodiment.

The RF request signal generating circuits are described below taking the RF request signal A generating circuit 50A as an example. FIG. 17 is a circuit block diagram showing the RF request signal A generating circuit 50A. The clock signal from the clock 130, the snooze signal /ZZ from the mode controller 110, the RF timing signal from the RF timing signal generating circuit 70, and the reset signal A from the block A controller 40A are input to the RF request signal A generating circuit 50A. The RF request signal A is output from the RF request signal A generating circuit 50A. Specific operations of the RF request signal A generating circuit 50A are described below.

7.1 Operations in Operating State and Nonselected State

When the leading edge of the RF timing signal is input to a pulsing circuit 52, a pulse at H level is generated. When this pulse is applied to an input S of a flip-flop 56, a signal at H level is output from an output Q of the flip-flop 56, and input to an input terminal 53b of a NAND gate 53.

In the operating state and the nonselected state of the semiconductor device 1, the snooze signal /ZZ at H level is input to an input terminal 55b of a NAND gate 55. When the clock signal at H level is input to the RF request signal generating circuit 50, the clock signal at H level is inverted by an inverter 57 and falls to L level. This L level signal is input to an input terminal 55a of the NAND gate 55. This allows the H level signal output from the NAND gate 55 to be input to an input terminal 53a of the NAND gate 53.

Since the signals at H level are input to the input terminals 53a and 53b, a signal at L level is output from the NAND gate 53, and applied to an input/S of a flip-flop 51. This allows the flip-flop 51 to be reset, whereby a signal at H level is output from an output Q of the flip-flop 51. This signal becomes the RF request signal A at H level (active).

Since the signal at L level output from the NAND gate 53 is also applied to an input /R of the flip-flop 56 through a delay circuit 54, a signal output from an output Q of the flip-flop 56 is at L level. The reasons there for are as follows. Even if the RF request signal A falls to L level (non-active) by allowing the flip-flop 51 to be reset by a reset signal A, the RF request signal A rises to H level (active) when the clock signal (H level) is input, although the leading edge of the RF timing signal is not input.

7.2 Operation in Power Saving State

When the leading edge of the RF timing signal is input to the pulsing circuit 52, a signal at H level is input to the input terminal 53b of the NAND gate 53 in the same manner as in the operations in the operating state and nonselected state.

In the power saving state of the semiconductor device 1, the snooze signal /ZZ at L level is input to the input terminal 55b of the NAND gate 55. This allows a signal at H level to be output from the NAND gate 55. This signal at H level is input to the input terminal 53a of the NAND gate 53.

Since the signals at H level are input to the input terminals 53a and 53b, the RF request signal A at H level (active) is output from the RF request signal A generating circuit 50A in the same manner as in the operations in the operating state and the nonselected state.

Other RF request signal generating circuits have the same structure as that of the RF request signal A generating circuit 50A, and operate in the same manner as the RF request signal A generating circuit 50A.

8. Row Predecoder

Figure 18:
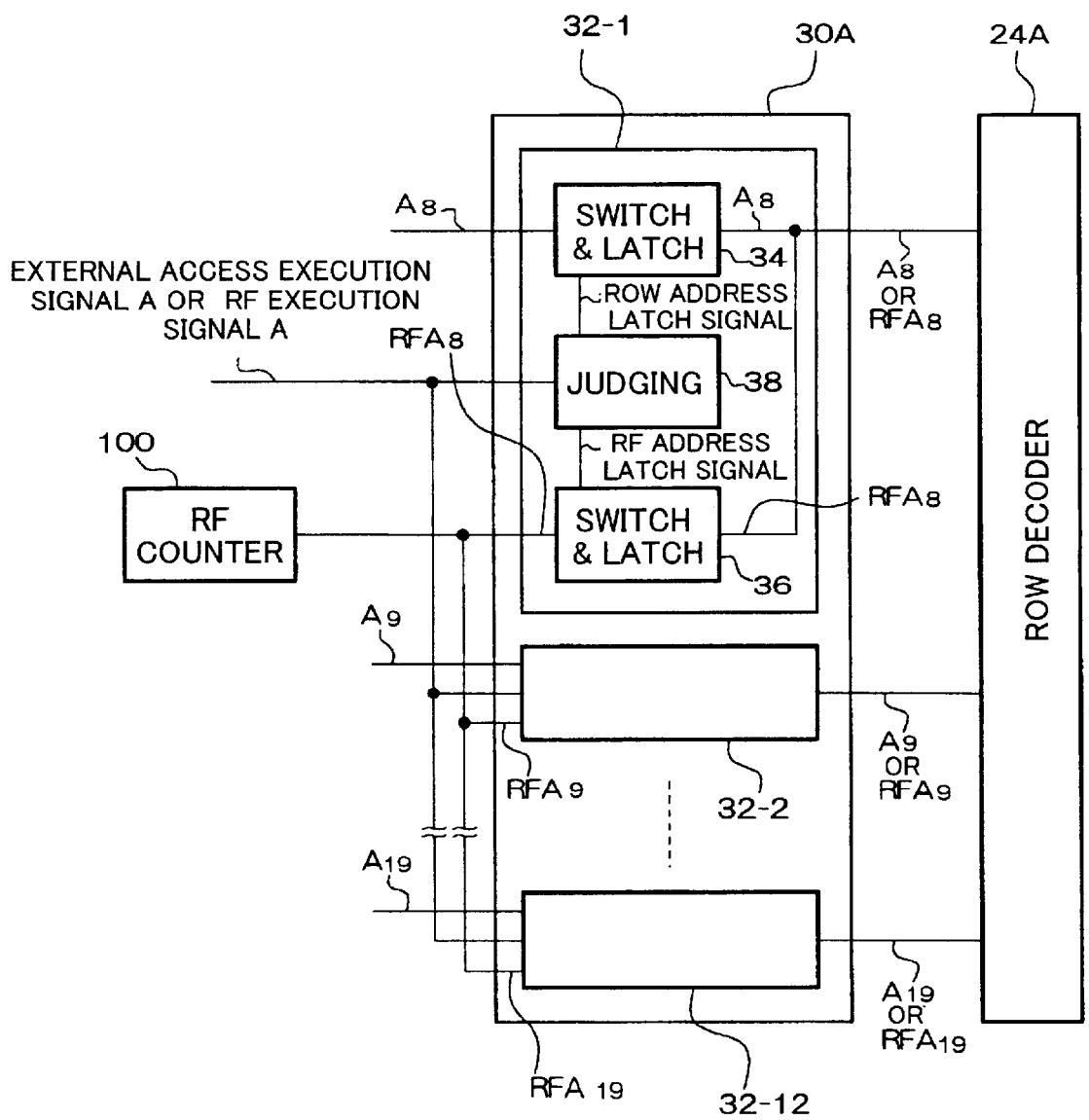
FIG. 18 is a circuit block diagram showing a row predecoder and circuits relating to the row predecoder provided in the semiconductor device according to the present embodiment.

The row predecoders 30A to 30D are described below in detail taking the row predecoder 30A as an example. FIG. 18 is a circuit block diagram showing the row predecoder 30A and circuits relating to the row predecoder 30A. The row predecoder 30A includes twelve selection sections 32-1 to 32-12 corresponding to the number of the row address signals $A_8$ to $A_{19}$. Each of the selection sections 32-1 to 32-12 selects the row address signal or refresh address signal.

Each of the selection sections 32-1 to 32-12 includes switch & latch circuits 34 and 36 and a judging circuit 38. The row address signal (row address signal $A_8$ in the case of selection section 32-1) is input to the switch & latch circuit 34. The refresh address signal (refresh address signal $RFA_8$ in the case of selection section 32-1) output from the RF counter 100 is input to the switch & latch circuit 36.

A signal output from the block A controller 40A (FIG. 1), specifically, either the external access execution signal A at H level or the RF execution signal A at H level is input to the judging circuit 38. When the judging circuit 38 judges that the external access execution signal A at H level is input to the judging circuit 38, the judging circuit 38 outputs a row address latch signal. Since the row address latch signal is input to the switch & latch circuit 34, the row address signal is latched by the switch & latch circuit 34 and output therefrom. This allows the row predecoder 30A to output the row address signals $A_8$ to $A_{19}$. These signals are for driving the word line which selects the memory cell which must be accessed externally. These drive signals are input to the row decoder 24A. The row decoder 24A selects the word line in a row to which the memory cell to be accessed externally belongs, based on the drive signals.

When the judging circuit 38 judges that the RF execution signal A at H level is input to the judging circuit 38, the judging circuit 38 outputs an RF address latch signal. Since the RF address latch signal is input to the switch & latch circuit 36, the RF address signal is latched by the switch & latch circuit 36 and output therefrom. This allows the row predecoder 30A to output the refresh address signals $RFA_8$ to $RFA_{19}$. These signals are signals for driving the word line which selects the memory cells in a row which must be refreshed. These drive signals are input to the row decoder 24A. The row decoder 24A selects the word line in a row which must be refreshed based on the drive signals.

The row predecoders 30B to 30D have the same structure as that of the row predecoder 30A, and operate in the same manner as the row predecoder 30A.

9. RF Counter Controller

In the present embodiment, refreshing is delayed in the block accessed externally as described in '2.1 Operating state' in '2. Refresh operation of semiconductor device'. In the present embodiment, the RF counter controller 90 is provided for enabling reliable refreshing in all the blocks A to D, as shown in FIG. 1.

The RF counter controller 90 outputs the count-up signal after refreshing of the memory cells selected by the word line in the n-th row is completed in all the blocks A to D. This allows the counter value of the RF counter 100 to be incremented by one, whereby the RF counter 100 outputs the refresh address signals $RFA_8$ to $RFA_{19}$ corresponding thereto. The output from the RF counter 100 allows the row predecoders 30A to 30D to supply signals for driving the word line in (n+1)th row.

Figure 19:
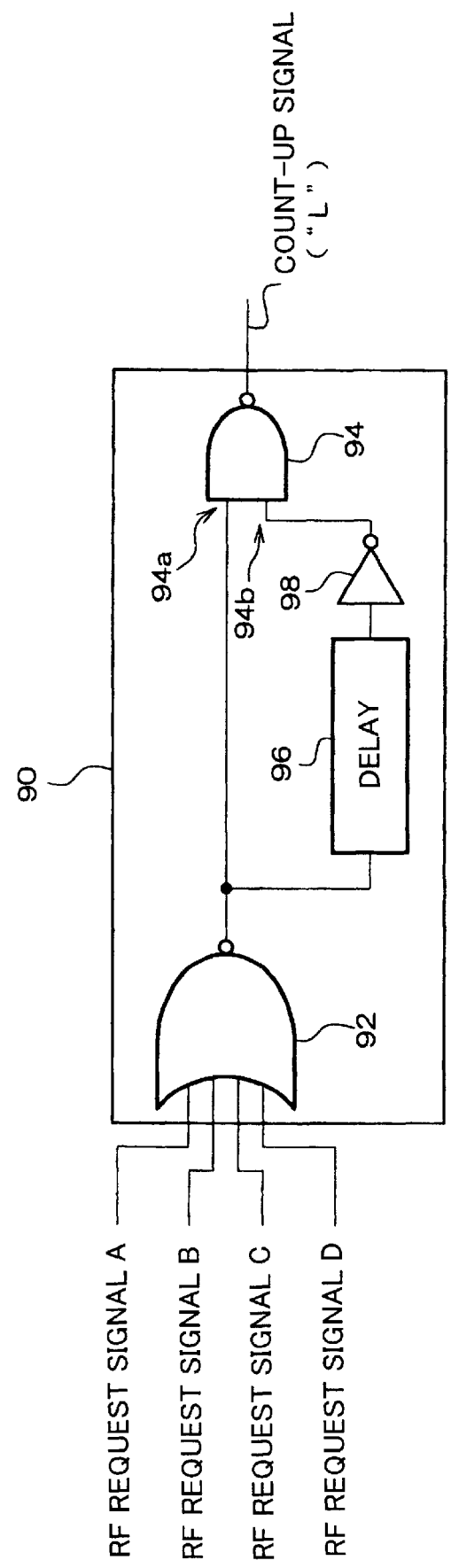
FIG. 19 is a circuit block diagram showing an RF counter controller provided in the semiconductor device according to the present embodiment.

FIG. 19 is a circuit block diagram showing the RF counter controller 90. The RF counter controller 90 includes a NOR gate 92, a NAND gate 94, a delay circuit 96, and an inverter 98.

The RF request signals A to D are input to the NOR gate 92. An output signal of the NOR gate 92 is input to the NAND gate 94. There are two paths for this signal. One is a path directly connecting an output terminal of the NOR gate 92 to an input terminal 94a of the NAND gate 94. The other is a path connecting the output terminal of the NOR gate 92 to an input terminal 94b of the NAND gate 94 through the delay circuit 96 and the inverter 98. An active-low count-up signal is output from the NAND gate 94.

Figure 20:
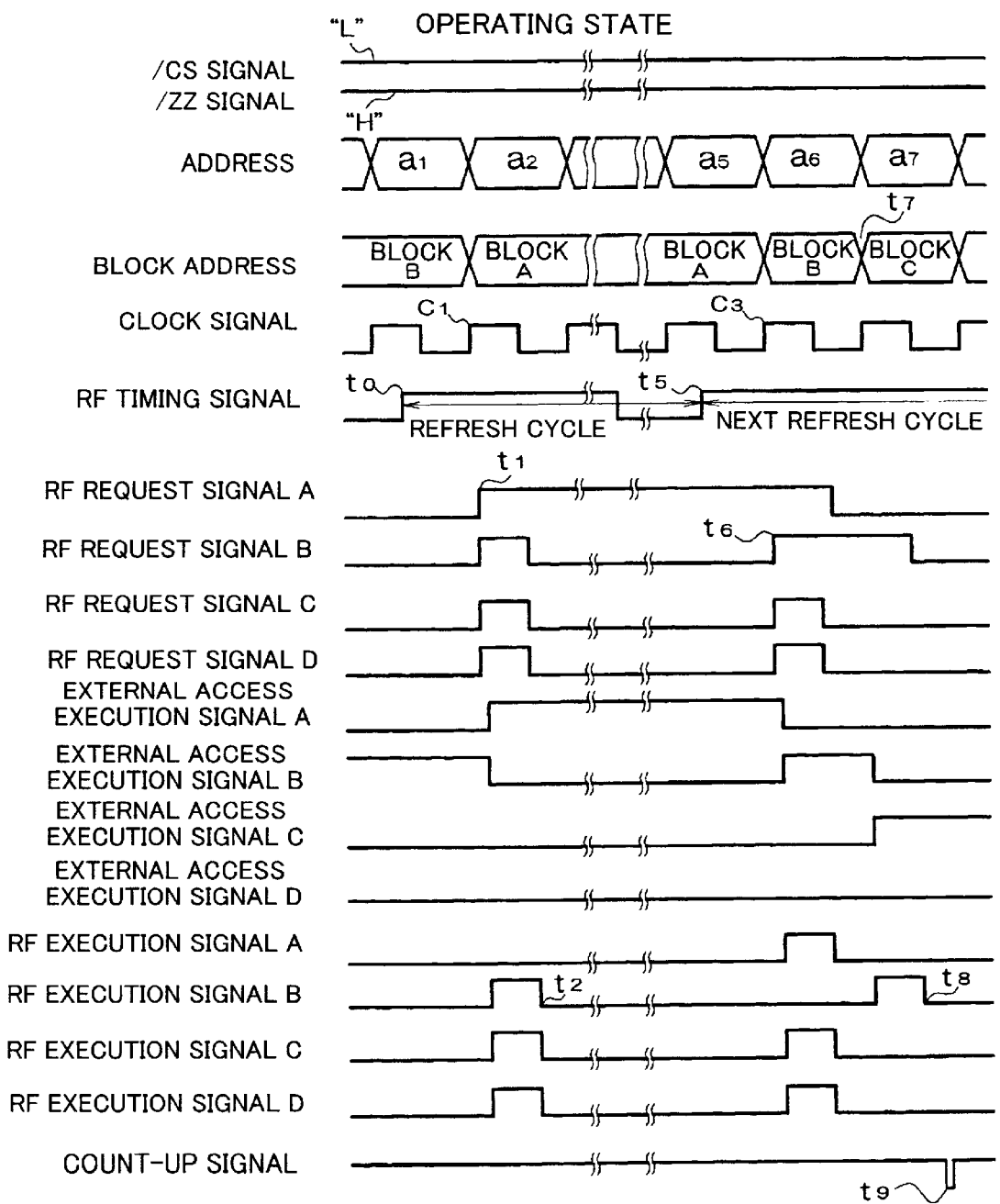
FIG. 20 is a timing chart of the semiconductor device according to the present embodiment in one period in the operation cycle.

The mechanism for allowing the RF counter controller 90 to output the count-up signal is described below with reference to FIGS. 1, 19, and 20. FIG. 20 is a timing chart of the semiconductor device 1 during one period in the operating state. The chip-select signal /CS is at L level, whereby the semiconductor device 1 is in the operating state.

The operations of the semiconductor device 1 from time $t_0$ to time $t_2$ are the same as the operations from time $t_0$ to time $t_2$ in the timing chart shown in FIG. 2. Specifically, the memory cells selected by the word line in the n-th row are refreshed in the block B, the block C, and the block D.

After the RF timing signal rises to H level (time $t_5$), the RF request signals B to D rise to H level based on the generation of the first clock signal ($c_3$) (time $t_6$).

Since the block A is continuously selected during a period from time $t_1$ to time $t_6$ (refreshing can be performed once in the blocks A to D during this period), the memory cells selected by the word line in the n-th row are not refreshed in the block A (delay of refreshing in one refresh cycle). Therefore, since the RF request signal A remains at H level during this refresh cycle, the NOR gate 92 outputs a signal at L level. Therefore, since the NAND gate 94 outputs a signal at H level during this refresh cycle, the count-up signal is not generated.

Therefore, the memory cells selected by the word line in the same row (n-th row) are refreshed in the blocks A to D during the next refresh cycle. In more detail, since the block B is selected at time $t_6$, the external access execution signal B and the RF execution signals A, C, and D rise to H level. This allows the memory cells selected by the word line in the n-th row to be refreshed in the blocks A, C, and D.

The block address is changed from the block B to the block C at time $t_7$. Since the RF request signal B is at H level, the RF execution signal B rises to H level. This RF execution signal B allows the memory cells selected by the word line in n-th row to be refreshed in the block B. After a specific period of time has elapsed, the RF request signal B falls to L level. This allows the RF execution signal to fall to L level, whereby refreshing is completed (time $t_8$). Refreshing of the memory cells selected by the word line in the n-th row is thus completed in the blocks A to D.

Since all the RF request signals A to D are at L level at time $t_8$, a signal at H level is output from the NOR gate 92. The signal at H level is immediately input to the input terminal 94a of the NAND gate 94. Since the signal at H level is continuously input to the input terminal 94b, the active low (L level) count-up signal is output from the NAND gate 94 (time $t_9$). The signal at H level output from the NOR gate 92 passes through the delay circuit 96, is caused to fall to L level by the inverter 98, and is input to the input terminal 94b. Therefore, the signal output from the NAND gate 94 immediately rises to H level.

The counter value of the RF counter 100 is incremented by one by the count-up signal. The RF counter 100 outputs the refresh address signal corresponding thereto, specifically, the address signal corresponding to the row which must be refreshed next. This output from the RF counter 100 allows the row predecoders 30A to 30D to supply signals for refreshing the memory cells selected by the word line in the (n+1) th row which must be refreshed next.

As described above, in the present embodiment, the memory cells selected by the word line in the (n+1)th row are not refreshed until the memory cells selected by the word line in the n-th row are refreshed in all the blocks A to D during one refresh cycle. Therefore, the memory cells in all rows can be refreshed reliably.

In the case of providing the RF counter controller 90, the refresh cycle must be determined taking into consideration a time period in which memory cells can hold data and the number of refresh cycles (number of rows (word lines) in each of the blocks A to D: 4096 in the present embodiment). The cycle of the RF timing signal (refresh cycle) is 50 μs under conditions that the time period in which memory cells can hold data is 200 ms and the number of refresh cycles is about 4000 (since the number of rows is 4096), for example.

50 μs×4000=200 ms

Data cannot be held under these conditions if refreshing is delayed only once. Therefore, the cycle of the RF timing signal (refresh cycle) is set at 45 μs, for example.

45 μs×4000=180 ms (200 ms−180 ms)÷45 μs≈444

Data can be held even if the refreshing is delayed up to 444 times by setting the cycle of the RF timing signal (refresh cycle) to 45 μs.

As shown in FIG. 20, the memory cells connected to the word line in the n-th row have not been refreshed in the block A during one refresh cycle (time $t_0$ to time $t_5$). In the present embodiment, the memory cells connected to the word line in n-th row (same row) are refreshed in the next refresh cycle (after time $t_5$). However, the present embodiment is not limited thereto. The memory cells connected to the word line in the (n+1)th row may be refreshed.

10. Application Example of Semiconductor Device to an Electronic Instrument

Figure 21:
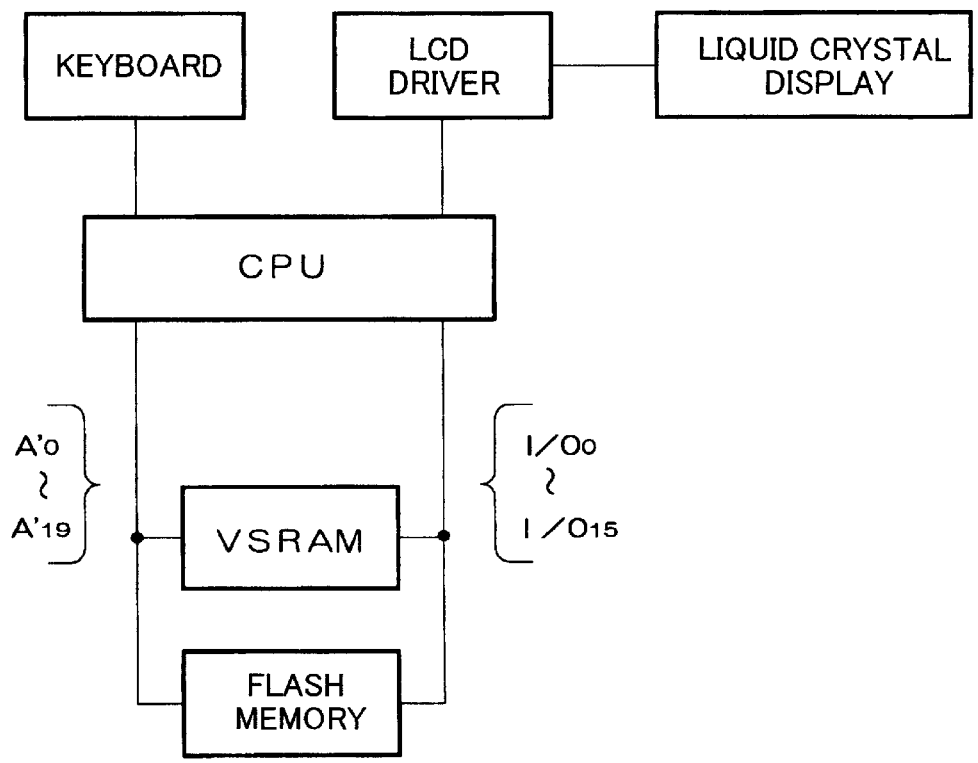
FIG. 21 is a circuit block diagram showing a system for portable telephones equipped with the semiconductor device according to the present embodiment.

The semiconductor device 1 may be applied to an electronic instrument such as portable equipment. FIG. 21 is a block diagram showing part of a system for portable telephones. The semiconductor device 1 is a VSRAM. A CPU, VSRAM, and flash memory are connected through bus lines for the address signals $A'_0$ to $A'_{19}$. The CPU, VSRAM, and flash memory are connected through bus lines for the data signals $I/O_0$ to $I/O_{15}$. The CPU is connected to a keyboard and an LCD driver through the bus lines. The LCD driver is connected to a liquid crystal display section through the bus lines. The CPU, VSRAM, and flash memory make up a memory system.

Figure 22:
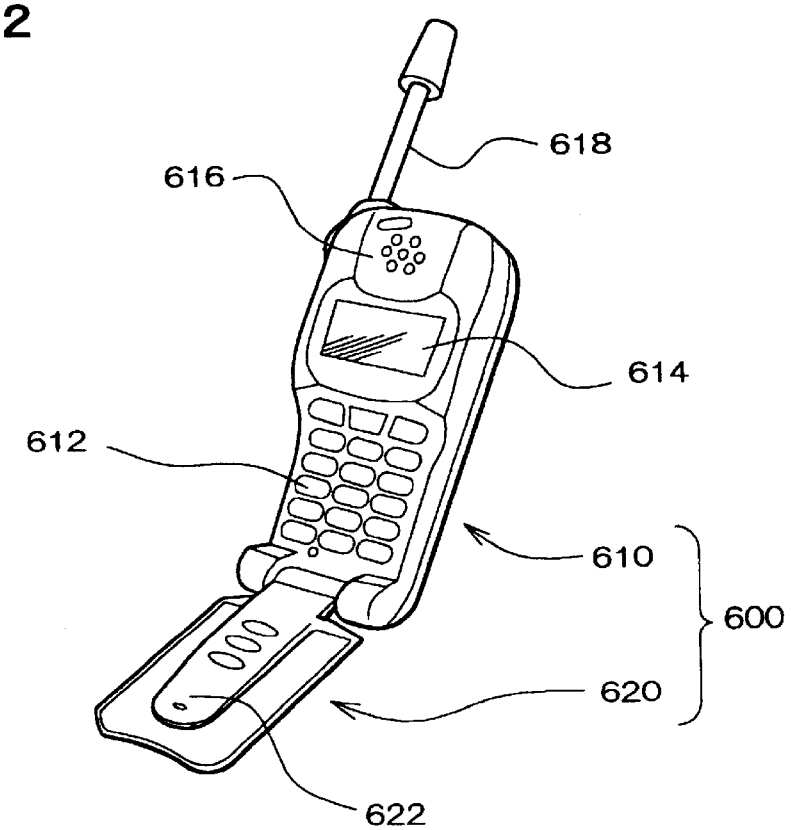
FIG. 22 is an oblique view showing a portable telephone equipped with the system for portable telephones shown in FIG. 21.

FIG. 22 is an oblique view showing a portable telephone 600 equipped with the system for portable telephones shown in FIG. 21. The portable telephone 600 includes a keyboard 612, a liquid crystal display section 614, a body section 610 including a receiver section 616 and an antenna section 618, and a cover 620 including a transmitter section 622.

What is claimed is:

1. A method of refreshing a semiconductor device including a memory cell array divided into a plurality of blocks, the method comprising:
    a first step of making the semiconductor device externally accessible,
    a second step of refreshing a block other than a block to be externally accessed among the plurality of blocks of the memory cell array in a first refresh cycle when the semiconductor device is in an externally accessible state;
    a third step of making the semiconductor device externally inaccessible; and
    a fourth step of refreshing each of the blocks in a second refresh cycle, which is longer than the first refresh cycle, when the semiconductor device is in an externally inaccessible state.

2. The method of refreshing a semiconductor device as defined in claim 1,
    wherein the second step comprises a step of generating a first refresh timing signal having a first cycle which becomes a reference of the first refresh cycle, and
    wherein the fourth step comprises a step of generating a second refresh timing signal which becomes a reference of the second refresh cycle and has a second cycle which is longer than the first cycle.

3. The method of refreshing a semiconductor device as defined in claim 1,
    wherein the third step is carried out when the semiconductor device enters a standby state.

4. The method of refreshing a semiconductor device as defined in claim 1,
    wherein the third step is carried out when the semiconductor device enters a power saving state.

5. The method of refreshing a semiconductor device as defined in claim 1,
    wherein the third step is carried out when the semiconductor device is in a nonselected state in which a chip select signal for selecting the semiconductor device is non-active.

6. The method of refreshing a semiconductor device as defined in claim 1,
    wherein the second refresh cycle is two to ten times as long as the first refresh cycle.

7. A semiconductor device which holds data by refreshing, comprising:
    a memory cell array divided into a plurality of blocks, and
    a refresh control circuit which refreshes a block other than a block to be externally accessed among the plurality of blocks of the memory cell array in a first refresh cycle when the semiconductor device is in an externally accessible state, and also refreshes each of the blocks in a second refresh cycle which is longer than the first refresh cycle when the semiconductor device is in an externally inaccessible state.

8. The semiconductor device as defined in claim 7, further comprising:
    a substrate voltage generating circuit which generates a substrate voltage to be applied to a semiconductor substrate on which the memory cell array is formed,
    wherein the substrate voltage generating circuit generates a voltage with the same value both in the externally accessible state and in the externally inaccessible state.

9. The semiconductor device as defined in claim 7,
    wherein the refresh control circuit comprises:
        a refresh timing signal generating circuit which generates a refresh timing signal,
        a plurality of refresh request signal generating circuits each of which is provided for each of the blocks and generates a refresh request signal to each of the corresponding blocks based on the refresh timing signal; and
        a plurality of block controllers each of which is provided for each of the blocks and supplies a refresh execution signal to a corresponding block based on the refresh request signal.

10. The semiconductor device as defined in claim 9,
    wherein the refresh timing signal generating circuit generates the refresh timing signal having a first cycle which becomes a reference of the first refresh cycle when the semiconductor device is in the externally accessible state, and
    wherein the refresh timing signal generating circuit generates the refresh timing signal having a second cycle which becomes a reference of the second refresh cycle when the semiconductor device is in the externally inaccessible state.

11. The semiconductor device as defined in claim 10,
    wherein the refresh timing signal generating circuit comprises:
        an oscillation circuit which generates the refresh timing signal, and
        a voltage regulating circuit which regulates a voltage to be applied to the oscillation circuit in order to generate the refresh timing signal having either one of the first cycle and the second cycle.

12. The semiconductor device as defined in claim 10,
    wherein the refresh timing signal generating circuit comprises:
        an oscillation circuit, and
        a dividing controller which generates the refresh timing signal having either one of the first cycle and the second cycle, by dividing a signal from the oscillation circuit.

13. The semiconductor device as defined in claim 7, further comprising a snooze terminal,
    wherein the semiconductor device is made externally inaccessible when a snooze signal input to the snooze terminal is active.

14. The semiconductor device as defined in claim 7, further comprising a chip select terminal, wherein the semiconductor device is made externally inaccessible when a chip select signal input to the chip select terminal is non-active.

15. The semiconductor device as defined in claim 7, wherein the second refresh cycle is two to ten times as long as the first refresh cycle.

16. The semiconductor device as defined in claim 7, comprising a virtually static RAM (VSRAM).

17. A memory system comprising the semiconductor device as defined in claim 7.

18. An electronic instrument comprising the semiconductor device as defined in claim 7.

* * * * *